United States Patent
Yang et al.

(10) Patent No.: US 9,245,637 B2
(45) Date of Patent: Jan. 26, 2016

(54) SYSTEMS AND METHODS FOR READ DISTURB MANAGEMENT IN NON-VOLATILE MEMORY

(71) Applicant: SanDisk Technologies Inc., Plano, TX (US)

(72) Inventors: Nian Niles Yang, Mountain View, CA (US); Chris Avila, Saratoga, CA (US); Steven Sprouse, San Jose, CA (US); Alexandra Bauche, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/020,634

(22) Filed: Sep. 6, 2013

(65) Prior Publication Data

US 2015/0071008 A1    Mar. 12, 2015

(51) Int. Cl.
| | |
|---|---|
| G11C 16/06 | (2006.01) |
| G11C 16/26 | (2006.01) |
| G11C 11/56 | (2006.01) |
| G11C 16/04 | (2006.01) |
| G11C 16/34 | (2006.01) |

(52) U.S. Cl.
CPC ............ *G11C 16/26* (2013.01); *G11C 11/5628* (2013.01); *G11C 16/0483* (2013.01); *G11C 16/3427* (2013.01); *G11C 16/3459* (2013.01)

(58) Field of Classification Search
CPC ............................ G11C 16/26; G11C 16/3427
USPC ............................ 365/185.18, 185.23, 185.02
See application file for complete search history.

(56) References Cited

U.S. PATENT DOCUMENTS

| | | | |
|---|---|---|---|
| 7,170,780 B2 | 1/2007 | Kawai | |
| 7,177,977 B2 | 2/2007 | Chen et al. | |
| 7,196,946 B2 | 3/2007 | Chen et al. | |
| 7,349,258 B2 | 3/2008 | Fong et al. | |
| 7,468,919 B2 | 12/2008 | Sekar et al. | |
| 7,468,920 B2 | 12/2008 | Sekar et al. | |
| 7,583,535 B2 | 9/2009 | Sekar et al. | |
| 7,701,784 B2 | 4/2010 | Maejima et al. | |
| 7,719,888 B2 | 5/2010 | Han | |
| 7,808,831 B2 | 10/2010 | Mokhlesi et al. | |
| 8,134,871 B2 | 3/2012 | Dutta et al. | |
| 8,472,266 B2 | 6/2013 | Khandelwal et al. | |

(Continued)

OTHER PUBLICATIONS

U.S. Appl. No. 61/610,387, filed Mar. 13, 2012.

*Primary Examiner* — Huan Hoang
*Assistant Examiner* — Jay Radke
(74) *Attorney, Agent, or Firm* — Vierra Magen Marcus LLP

(57) ABSTRACT

Non-volatile memory and methods of reading non-volatile memory are provided for managing and reducing read related disturb. Techniques are introduced to reduce read disturb using state-dependent read pass voltages for particular word lines during a read operation. Because of their proximity to a selected word line, adjacent word lines can be biased using state-dependent pass voltages while other unselected word lines are biased using a standard or second set of pass voltages. Generally, each state-dependent pass voltage applied to a word line adjacent to the selected word line is larger than the second set of pass voltages applied to other unselected word lines, although this is not required. Other word lines, may also be biased using state-dependent pass voltages. System-level techniques are provided with or independently of state-dependent pass voltages to further reduce and manage read disturb. Techniques may account for data validity and memory write and erase cycles.

19 Claims, 19 Drawing Sheets

(56) References Cited

U.S. PATENT DOCUMENTS

| | | | |
|---|---|---|---|
| 2005/0254302 A1* | 11/2005 | Noguchi | 365/185.17 |
| 2007/0195603 A1* | 8/2007 | Aritome et al. | 365/185.23 |
| 2008/0266973 A1* | 10/2008 | Sekar et al. | 365/185.21 |
| 2008/0266975 A1* | 10/2008 | Sekar et al. | 365/185.23 |
| 2010/0008136 A1 | 1/2010 | Seol et al. | |
| 2010/0067299 A1* | 3/2010 | Futatsuyama | 365/185.17 |
| 2010/0165741 A1* | 7/2010 | Han | 365/185.19 |
| 2011/0157997 A1* | 6/2011 | Kamigaichi et al. | 365/185.22 |
| 2011/0292726 A1 | 12/2011 | Lee et al. | |
| 2011/0317489 A1* | 12/2011 | Kim et al. | 365/185.18 |
| 2012/0120727 A1* | 5/2012 | Kim et al. | 365/185.17 |
| 2012/0170375 A1* | 7/2012 | Sim et al. | 365/185.19 |
| 2012/0218850 A1* | 8/2012 | Youn | 365/226 |
| 2013/0201760 A1 | 8/2013 | Dong et al. | |
| 2013/0242661 A1* | 9/2013 | Lei et al. | 365/185.17 |

* cited by examiner

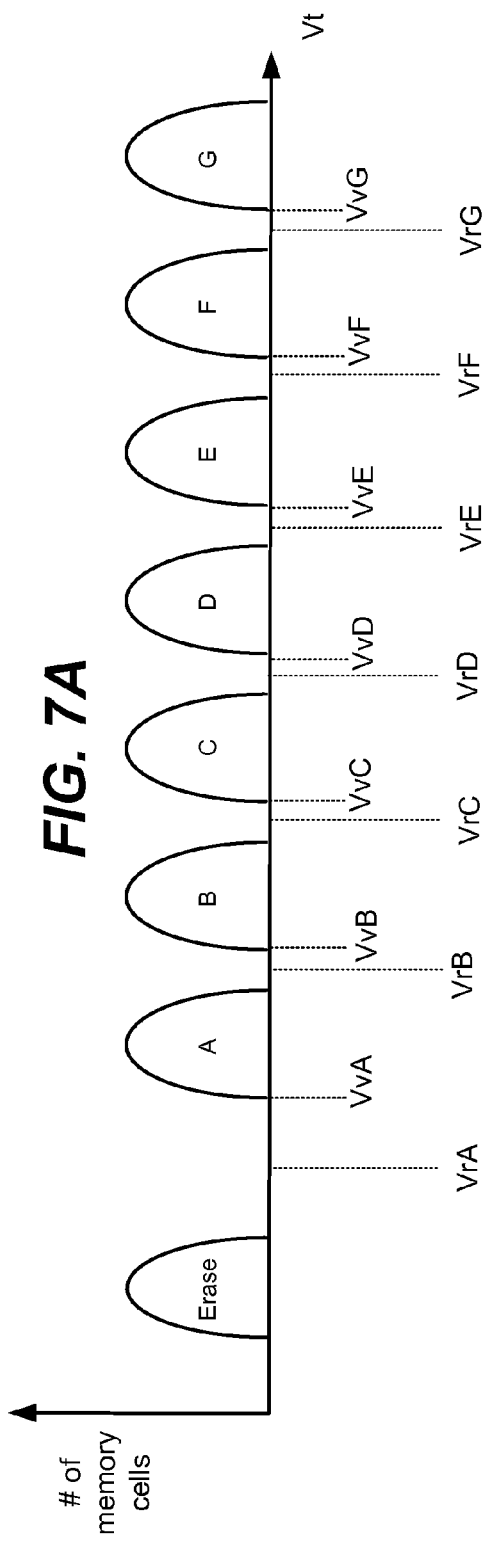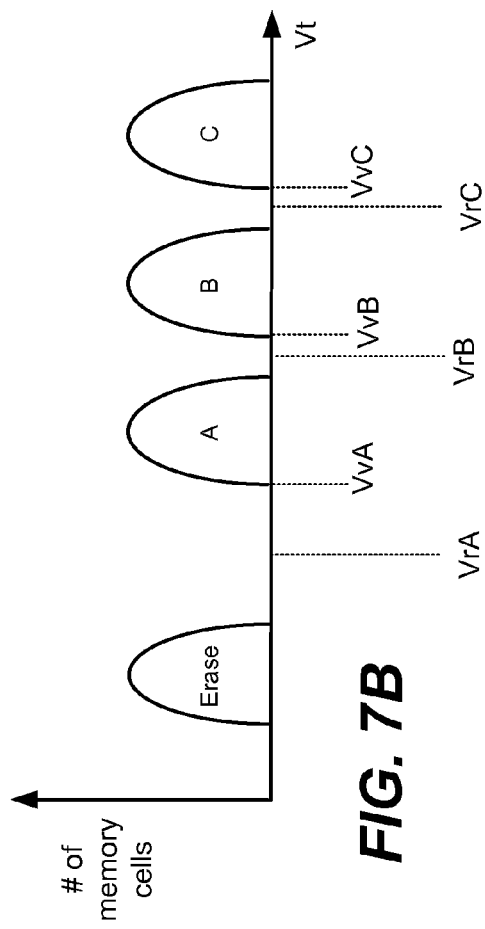

SYSTEMS AND METHODS FOR READ DISTURB MANAGEMENT IN NON-VOLATILE MEMORY

BACKGROUND

The disclosed technology is related to non-volatile memory.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both traditional EEPROM and flash memory utilize a floating gate (FG) that is positioned above and insulated from a channel region in a semiconductor substrate. The floating gate is positioned between the source and drain regions. A control gate (CG) is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a read compare voltage or read voltage Vread is applied to the control gate of a selected memory cell during a read operation. In some architectures, a read pass voltage (e.g., Vpass) is applied to control gates of unselected memory cells while the read compare voltage Vread is applied to the selected memory cell. The read pass voltage may be an appropriate magnitude to cause unselected memory cells to conduct.

Read disturb refers to undesirably altering the charge on a floating gate during a read operation. Altering the charge on the floating gate, alters the threshold voltage. With each read, the amount of disturb may be extremely small. However, after many reads, the effects may add up such that the threshold voltages are significantly altered. Note that in some cases, it may be unselected memory cells that suffer from read disturb.

BRIEF DESCRIPTION OF THE DRAWINGS

FIG. 7A is an example of threshold voltage distributions for memory cells storing data in eight states.

FIG. 7B is an example of threshold voltage distributions corresponding to data states for a memory cell array when each memory cell stores two bits of data.

DETAILED DESCRIPTION

Figure 1A:
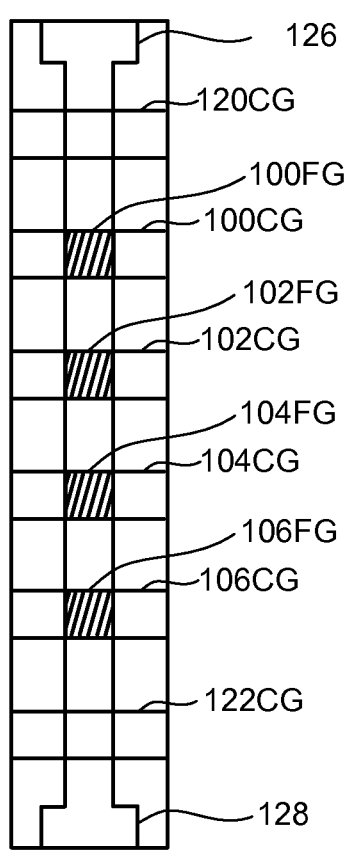
FIG. 1A is a top view of a NAND string.

Systems and methods of managing and reducing read related disturbs are provided. In an architecture with serially-aligned memory cells for example, techniques are introduced to reduce read disturb using state-dependent read pass voltages for particular word lines during the read operation. When a word line is selected for reading, one or more adjacent word lines immediately neighboring the selected word line can be identified. Because of their proximity to the selected word line, these word lines can be biased using state-dependent pass voltages while other unselected word lines are biased using a standard or default pass voltages. Generally, each state-dependent pass voltage applied to a word line adjacent to the selected word line is larger than the default pass voltage applied to other unselected word lines, although some state-dependent pass voltages may be equal to a default pass voltage. Other word lines, such as those adjacent to the immediately neighboring word lines, may also be biased using state-dependent pass voltages.

System-level techniques are provided with or independently of state-dependent pass voltages to further reduce and manage read disturb. In one embodiment, a memory controller or other circuitry tracks the validity of data stored with memory blocks. When performing a read operation, the controller determines whether the data for any word lines that are to receive state-dependent pass voltages is invalid. If data is invalid such as by being identified for garbage collection, the controller may use standard pass voltages for one or more word lines that would otherwise receive state-dependent pass voltages. The controller further uses write/erase cycling and word line position to tailor state-dependent pass voltages.

In one example, when a string of serially-connected memory cells are read, one or more pass voltages are applied to unselected word lines while a series of read compare voltages is applied to a selected word line. Typically, the read compare voltages are lower than any of the pass voltages. Because of their proximity to a selected word line, the memory cells of word lines adjacent to the selected word line may experience unequal coupling when compared to other unselected memory cells on other unselected word lines. Read disturb may be promoted more on the memory cells of the adjacent word lines because of this unequal coupling. Additionally, this unequal coupling may lower the potential on the control gate of the adjacent memory cells such that higher pass voltages are used. These higher pass voltages may in turn increase read disturb.

State-dependent pass voltages applied to the adjacent word lines of a selected word line may reduce read disturb, while providing proper conduction through the string for sensing. State-dependent pass voltages may be applied in inverse relation to the level of the read compare voltages to maintain more consistent biasing for the adjacent memory cells. To compensate for a lower read compare voltage which will have a larger tendency to pull down the control gate voltage of an adjacent memory cell, the state-dependent pass voltage for the adjacent memory cells may be relatively high in relation to the pass voltage applied to other unselected memory cells. To compensate when a higher read compare voltage is applied which will have a smaller tendency to pull down the control gate voltage of the adjacent memory cell, the state-dependent pass voltage for the adjacent memory cells may still be higher, but closer to the value of the pass voltage applied to other unselected memory cells.

In one example, a set of three or more read compare voltages are applied to a selected word line as part of reading the memory cells connected to the word line. While the read compare voltages are applied, a pass voltage is applied to each of the unselected word lines. A first set of state-dependent pass voltages that correspond to the read compare voltages are applied to one or more word lines that are adjacent to the selected word line. A default pass voltage is applied to one or more other unselected word lines. The first set of state-dependent pass voltages includes a first pass voltage that corresponds to a first read compare voltage, a second pass voltage that corresponds to a second read compare voltage, and a third pass voltage that corresponds to a third read compare voltage. The default pass voltage is less than or equal to each of the first pass voltages in the first set.

Figure 1B:
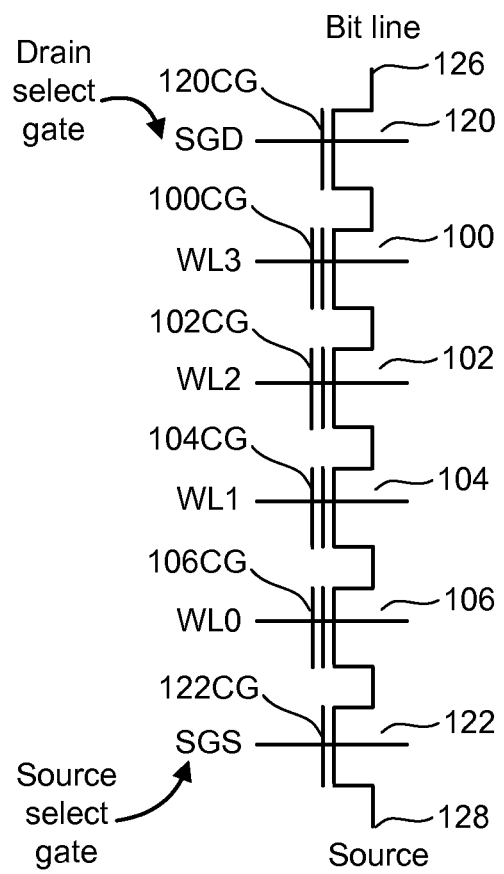
FIG. 1B is an equivalent circuit diagram of the NAND string of FIG. 1A.

One example of a memory system suitable for implementing embodiments uses a NAND flash memory architecture, which includes connecting multiple transistors in series between two select gates. The transistors connected in series and the select gates are referred to as a NAND string. FIG. 1A is a top view showing one NAND string. FIG. 1B is an equivalent circuit thereof. The NAND string includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to (or is) word line WL3, (where WL denotes "word line"), control gate 102CG is connected to WL2, control gate 104CG is connected to WL1, and control gate 106CG is connected to WL0. In one embodiment, transistors 100, 102, 104 and 106 are each storage elements, also referred to as memory cells. In other embodiments, the storage elements may include multiple transistors or may be different than depicted. Select gate 120 is connected to select line SGD. Select gate 122 is connected to select line SGS.

Figure 2:
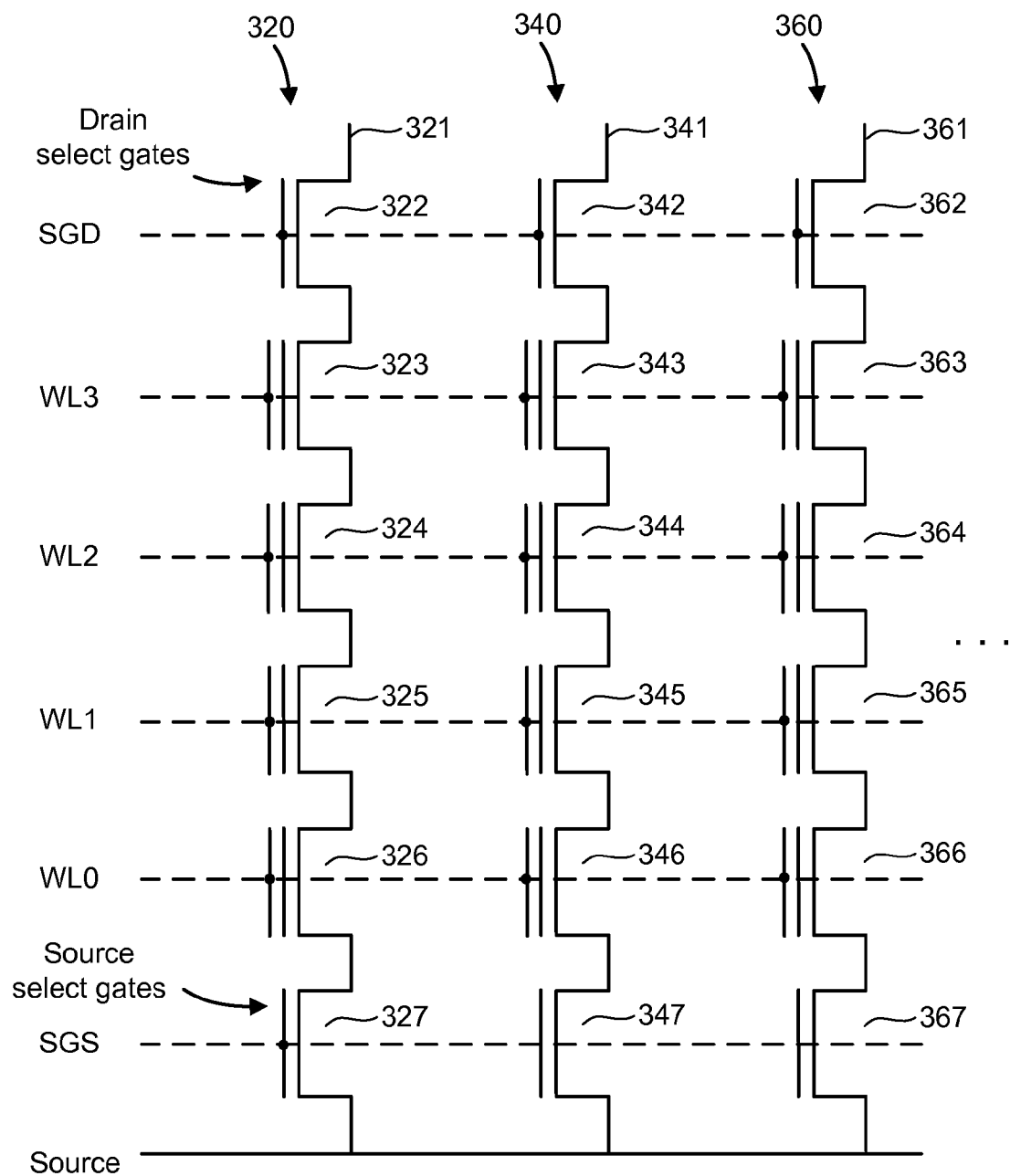
FIG. 2 is a circuit diagram depicting three NAND strings.

FIG. 2 is a circuit diagram depicting three NAND strings. A typical architecture for a flash memory system using a NAND structure will include many NAND strings. For example, three NAND strings 320, 340 and 360 are shown in a memory array having many more NAND strings. Each of the NAND strings includes two select gates and four storage elements. While four storage elements are illustrated for simplicity, NAND strings can have thirty-two or sixty-four storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line by its select gates (e.g., select gates 327, 347 or 367). A selection line SGS is used to control the source side select gates. The various NAND strings 320, 340 and 360 are connected to respective bit lines 321, 341 and 361, by select transistors in the select gates 322, 342, 362, and so forth. These select transistors are controlled by a drain select line SGD. In other embodiments, the select lines do not necessarily need to be in common among the NAND strings; that is, different select lines can be provided for different NAND strings. WL3 is connected to the control gates for storage elements 323, 343 and 363. WL2 is connected to the control gates for storage elements 324, 344 and 364. WL1 is connected to the control gates for storage elements 325, 345 and 365. WL0 is connected to the control gates for storage elements 326, 346 and 366. As can be seen, each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, WL2 provides the control gates for storage elements 324, 344 and 364. In practice, there can be thousands of storage elements on a word line.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation may be positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values may be used for the states of "10", "01", and "00." The specific relationship between the data programmed into the storage element and the threshold voltage ranges of the storage element depends upon the data encoding scheme adopted for the storage elements.

When programming a flash storage element, a program voltage is applied to the control gate of the storage element, and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 2, the program voltage will also be applied to the control gates of storage elements 344 and 364.

The charge storage elements of current flash EEPROM arrays are most commonly electrically conductive floating gates, typically formed from a doped polysilicon material. Another type of memory cell useful in flash EEPROM systems utilizes a non-conductive dielectric material in place of a conductive floating gate to form a charge storage element capable of storing charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," EEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor.

Figure 3:
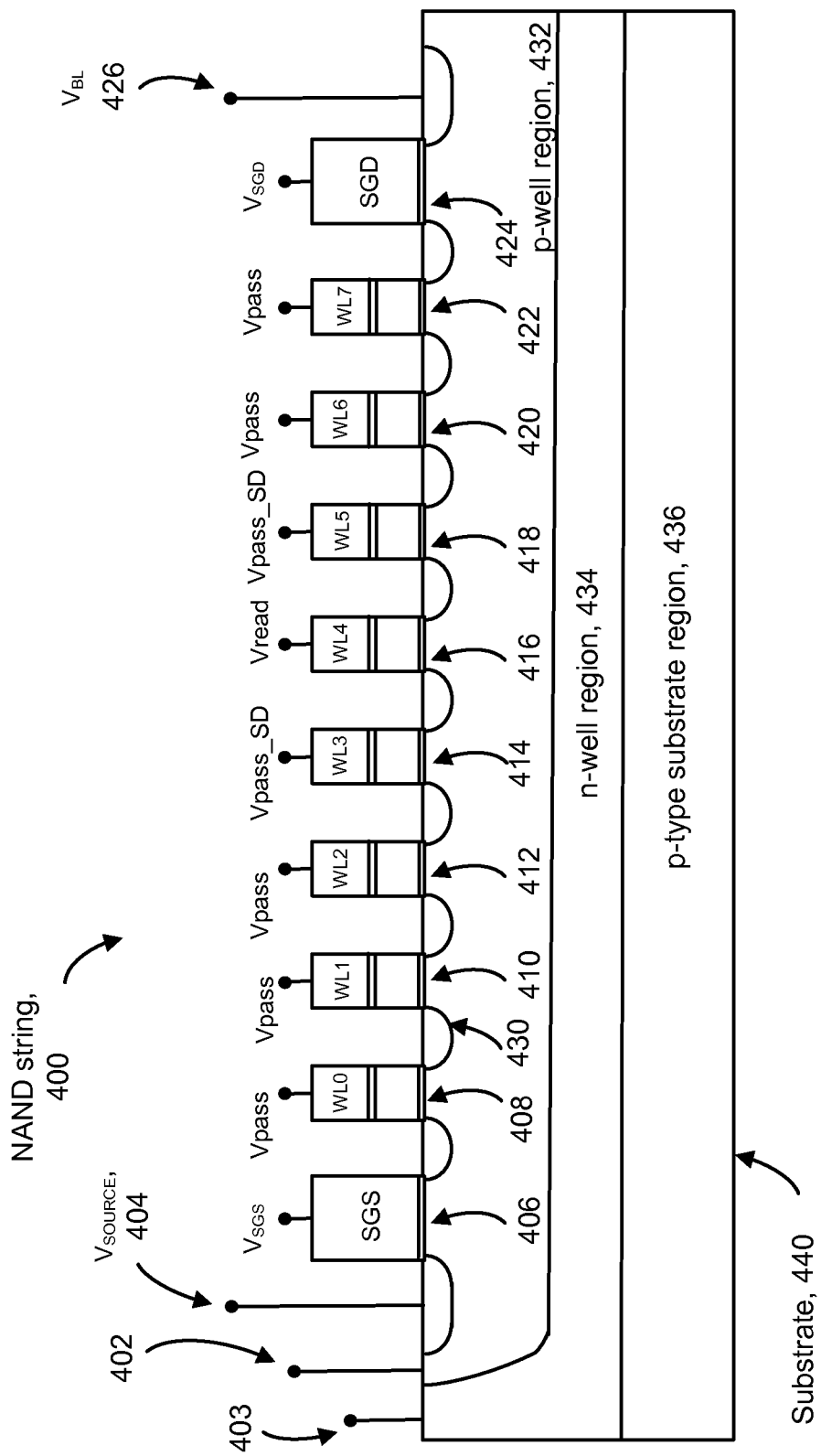
FIG. 3 is a cross-sectional view of a NAND string.

FIG. 3 depicts a cross-sectional view of a NAND string formed on a substrate. The view is simplified and not to scale. The NAND string 400 includes a source-side select gate 406, a drain-side select gate 424, and eight storage elements 408, 410, 412, 414, 416, 418, 420 and 422, formed on a substrate 440. A number of source/drain regions, one example of which is source/drain region 430, are provided on either side of each storage element and the select gates 406 and 424.

In one approach, the substrate 440 employs a triple-well technology which includes a p-well region 432 within an n-well region 434, which in turn is within a p-type substrate region 436. The NAND string and its non-volatile storage elements can be formed, at least in part, on the p-well region. A source supply line 404 with a potential of $V_{SOURCE}$ is provided in addition to a bit line 426 with a potential of $V_{BL}$. Voltages, such as body bias voltages, can also be applied to the p-well region 432 via a terminal 402 and/or to the n-well region 434 via a terminal 403. During a read or verify operation, a control gate voltage Vread is provided on a selected word line, in this example, WL4, which is associated with storage element 416. Further, recall that the control gate of a storage element may be provided as a portion of the word line. For example, WL0, WL1, WL2, WL3, WL4, WL5, WL6 and WL7 can extend via the control gates of storage elements 408, 410, 412, 414, 416, 418, 420 and 422, respectively. A pass voltage, Vpass is applied to at least some of the remaining word lines associated with NAND string 400, in this embodiment. Vpass is a standard or default pass voltage in one example. Note that pass voltage Vpass_SD is applied to the word lines that are adjacent to the selected word line. The level of this state-dependent (SD) pass voltage varies with the level of Vread to reduce read disturb that might otherwise occur on the memory cells that immediately neighbor the selected memory cell. Furthermore, the varying level of Vpass_SD also provides conduction through the channel region of NAND string 400 as needed during sensing. $V_{SGS}$ and $V_{SGD}$ are applied to the select gates 406 and 424, respectively.

Figure 4:
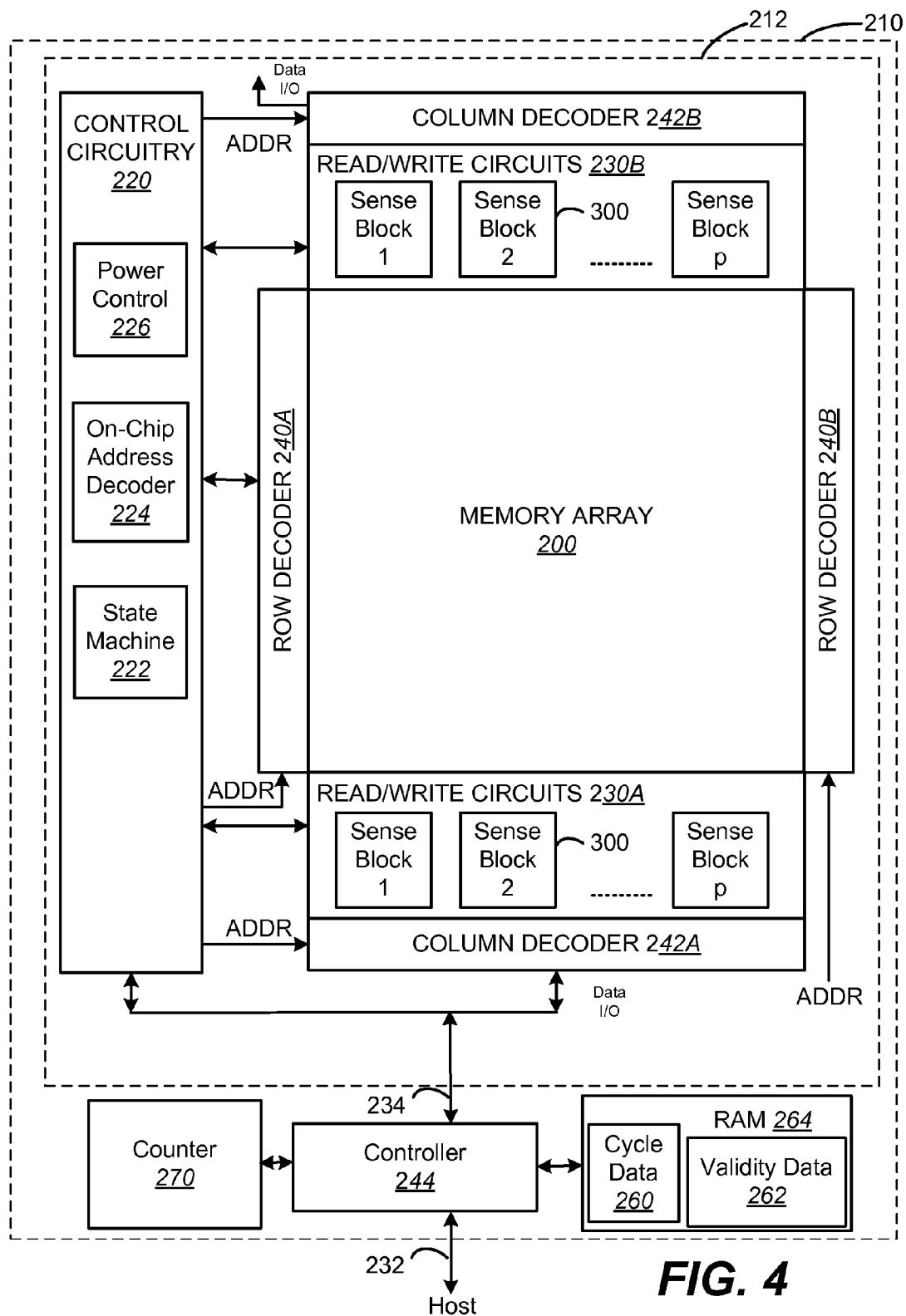
FIG. 4 is a block diagram of a non-volatile storage device that may include one or more memory die or chips.

FIG. 4 illustrates a non-volatile storage device 210 that may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface to convert between the address that is used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 5:
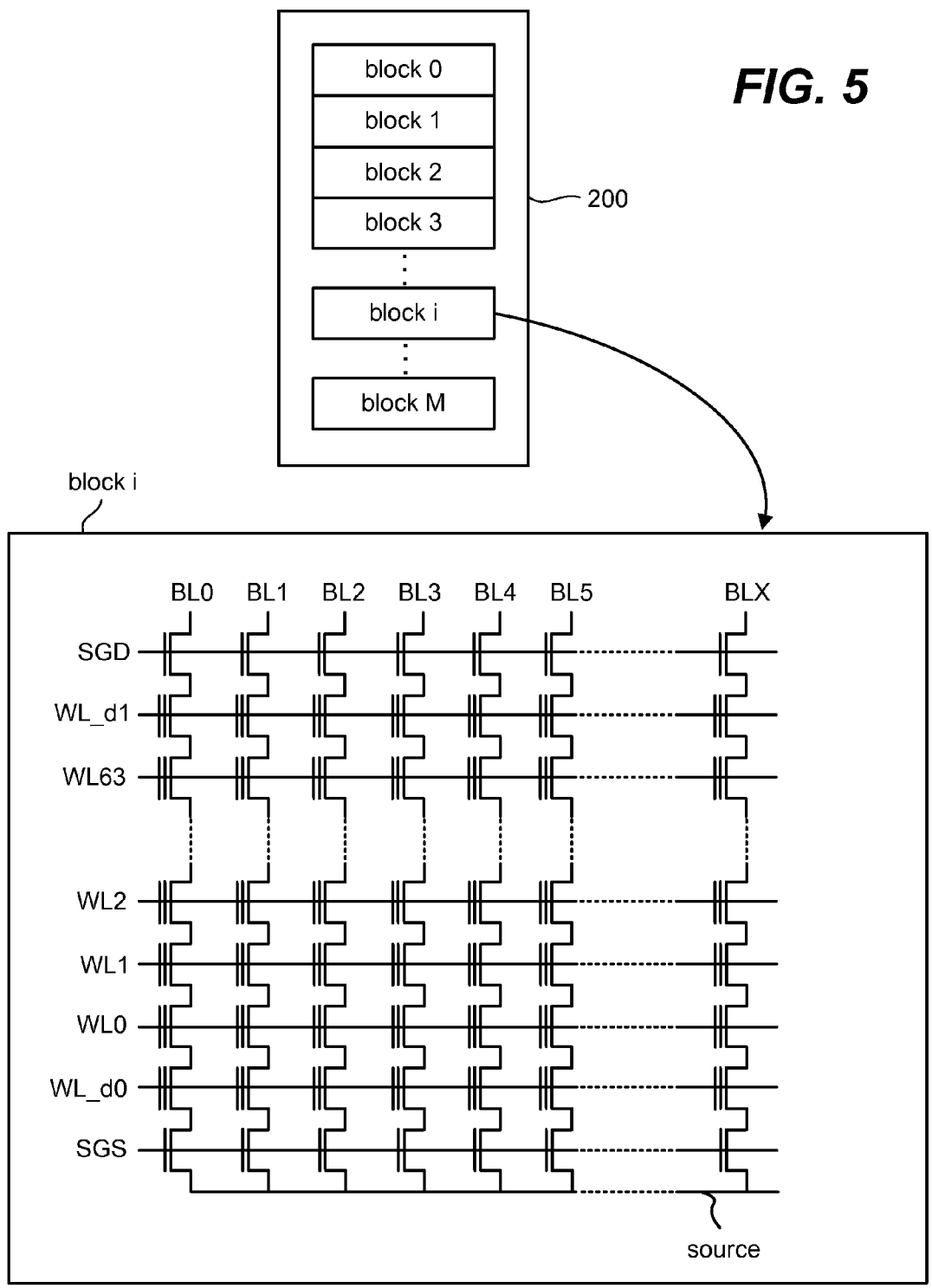
FIG. 5 is a block diagram depicting an exemplary structure of memory cell array.

FIG. 5 depicts an exemplary structure of memory cell array 200. In one embodiment, the array of memory cells is divided into M blocks of memory cells. As is common for flash EEPROM systems, the block is the unit of erase. That is, each block contains the minimum number of memory cells that are erased together. Each block is typically divided into a number of pages. A page is a unit of programming One or more pages of data are typically stored in one row of memory cells. A page can store one or more sectors. A sector includes user data and overhead data. Overhead data typically includes parity bits of an Error Correction Code (ECC) that have been calculated from the user data of the sector. A portion of the controller (described below) calculates the ECC parity when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks and arrangements can also be used.

In another embodiment, the bit lines are divided into odd bit lines and even bit lines. In an odd/even bit line architecture, memory cells along a common word line and connected to the odd bit lines are programmed at one time, while memory cells along a common word line and connected to even bit lines are programmed at another time.

FIG. 5 also shows more details of block i of memory array 200. Block i includes X+1 bit lines and X+1 NAND strings. Block i also includes 64 data word lines (WL0-WL63), 2 dummy word lines (WL_d0 and WL_d1), a drain side select line (SGD) and a source side select line (SGS). One terminal of each NAND string is connected to a corresponding bit line via a drain select gate (connected to select line SGD), and another terminal is connected to the source line via a source select gate (connected to select line SGS). Because there are sixty four data word lines and two dummy word lines, each NAND string includes sixty four data memory cells and two dummy memory cells. In other embodiments, the NAND strings can have more or fewer than 64 data memory cells and more or fewer dummy memory cells. Data memory cells can store user or system data. Dummy memory cells are typically not used to store user or system data. Some embodiments do not include dummy memory cells.

Figure 6:
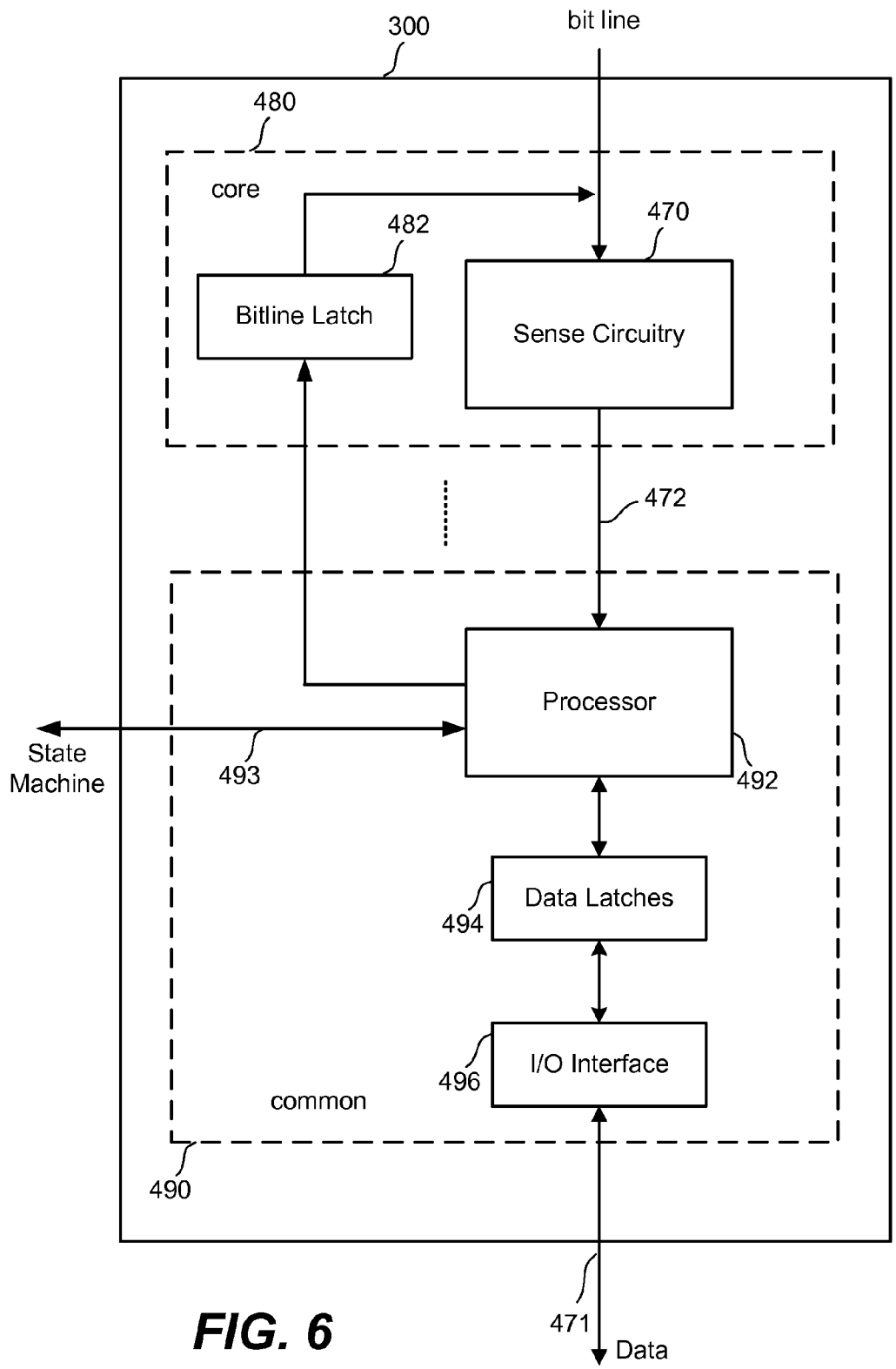
FIG. 6 is a block diagram of an individual sense block.

FIG. 6 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. For further details, refer to U.S. Patent Application Publication 2006/0140007, filed Dec. 29, 2004, and titled, "Non-volatile memory and method with shared processing for an aggregate of read/write circuits," which is hereby incorporated herein by reference in its entirety.

Sense module 480 comprises sense circuitry 470 that determines whether a conduction current in a connected bit line is above or below a predetermined threshold level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 471. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 471 during a program operation. The imported data bits represent write data meant to be programmed into the memory. I/O interface 496 provides an interface between data latches 494 and the data bus 471.

During read or sensing, the operation of the system is under the control of state machine 222 that controls the supply of different control gate voltages to the addressed cell. As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 6) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time.

During program or verify, the data to be programmed is stored in the set of data latches 494 from the data bus 471. The program operation, under the control of the state machine, comprises a series of programming voltage pulses (with increasing magnitudes) applied to the control gates of the addressed memory cells. Each programming pulse may be followed by a verify process to determine if the memory cell has been programmed to the desired state. Processor 492 monitors the verified memory state relative to the desired memory state. When the two are in agreement, processor 492 may set the bit line latch 482 so as to cause the bit line to be pulled to a state designating program inhibit. This inhibits the cell coupled to the bit line from further programming even if it is subjected to programming pulses on its control gate. In other embodiments the processor initially loads the bit line latch 482 and the sense circuitry sets it to an inhibit value during the verify process.

Data latch stack 494 contains a stack of data latches corresponding to the sense module. In one embodiment, there are 3-5 (or another number) data latches per sense module 480. In one embodiment, the latches are each one bit. In some implementations (but not required), the data latches are implemented as a shift register so that the parallel data stored therein is converted to serial data for data bus 471, and vice versa. In one embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the read operations and sense amplifiers can be found in (1) U.S. Pat. No. 7,196,931, "Non-Volatile Memory And Method With Reduced Source Line Bias Errors,"; (2) U.S. Pat. No. 7,023,736, "Non-Volatile Memory And Method with Improved Sensing,"; (3) U.S. Patent Application Pub. No. 2005/0169082; (4) U.S. Pat. No. 7,196,928, "Compensating for Coupling During Read Operations of Non-Volatile Memory," and (5) United States Patent Application Pub. No. 2006/0158947, "Reference Sense Amplifier For Non-Volatile Memory," published on Jul. 20, 2006. All five of the immediately above-listed patent documents are incorporated herein by reference in their entirety.

At the end of a successful programming process (with verification), the threshold voltages of the memory cells should be within one or more distributions of threshold voltages for programmed memory cells or within a distribution of threshold voltages for erased memory cells, as appropriate. FIG. 7A depicts example threshold voltage distributions for states of memory cells in which there are eight states. The eight data states include an erase state and states A-G. In this example, three bits may be stored per memory cell. Between each of the data states are read reference voltages used for reading data from memory cells. For example, FIG. 7A shows read reference voltage Vra between data states erase and A, and Vrb between data states A and B. By testing whether the threshold voltage of a given memory cell is above or below the respective read reference voltages, the system can determine what state the memory cell is in. At or near the lower edge of each data state are verify reference voltages. For example, FIG. 7A shows VvA for state A and VvB for state B, etc. When programming memory cells to a given state, the system will test whether those memory cells have a threshold voltage greater than or equal to the verify reference voltage.

FIG. 7B illustrates example threshold voltage distributions corresponding to data states for the memory cell array when each memory cell stores two bits of data. Other embodiments, however, may use more or fewer than two bits of data per memory cell.

Note also that although a distinct gap is depicted between each data state in Figures &a and 7B, this may not be the case. For example, there may be some overlap between the threshold voltage distributions. In this case, error recovery may be used to correctly read the state of each memory cell.

Figure 8:
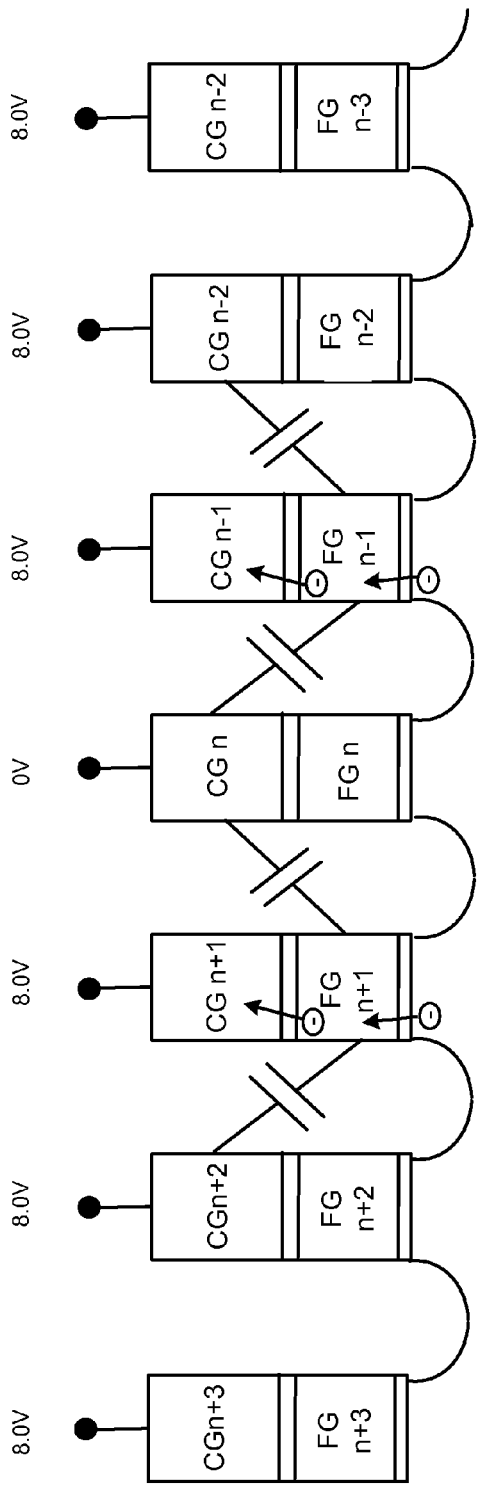
FIG. 8 is a cross-sectional view of a NAND string illustrating the occurrence of read disturb during traditional biasing for a read operation.

FIG. 8 depicts one example of read disturb effects on a string of non-volatile memory cells. A portion of a NAND string is depicted, with an example of voltages being applied to control gates. The selected memory cell has a floating gate labeled FGn and a control gate labeled CGn. The selected memory cell may be referred to as memory cell n. Unselected memory cells are referred to by n+1, n+2, etc. depending on their relative location to the selected memory cell. For example, the voltage Vcgrv applied to the control gate of the selected memory cell is 0V and the voltages Vpass applied to control gates of unselected memory cells is 8.0V. There is coupling between the control gate of the selected memory cell and the floating gate of the immediate neighbor memory cells (CG to neighbor FG coupling). The FG of every unselected memory cell has some amount of capacitive coupling with the CG of its neighbors. Moreover, there is coupling between neighboring control gates and neighboring floating gates.

The floating gate and control gate of memory cells that are neighbors to the selected memory cell may experience different amounts of coupling compared to memory cells that are neighbors to unselected memory cells. While a Vread voltage of 0V (e.g., VrA) is applied to control gate CGn of the selected memory cell, a Vpass voltage of 8.0V is applied to control gate of other unselected memory cells. Because the selected memory cell has 0V on its CG, the CG-to-neighbor FG coupling effect may reduce the FG potential of memory cells n+1 and n−1 compared to the FG potential of other unselected memory cells, both of whose neighbors are at 8.0V. A net result of lower FG potential of memory cells n+1 and n−1 is that memory cells n+1 and n−1 may suffer a greater read disturb by IPD leakage than other unselected memory cells. This IPD leakage read disturb may result from the increase in electric field for n+1 and n−1 due to the reduction in FG potential of n+1 and n−1 resulting from the selected memory cell being at 0V. This IPD leakage for memory cells n+1 and n−1 can result in loss of electrons from their FGs to their CGs which reduces the memory cell's threshold voltage. The loss of electrons from the FG of n+1 and n−1 to the CG of n+1 and n−1 that results from IPD leakage is illustrated by the arrows and electrons in FIG. 8.

The greater the potential difference between a memory cell's FG and CG, the more significant the IPD leakage may be. For memory cell's n+1 and n−1, the CG-to-neighbor FG coupling may result in a greater potential difference between the memory cell's FG and CG than for the other unselected memory cells (other factors being equal). A reason for this is that the 0V applied to the selected CG may pull down the voltage on the FG of the neighbor. This may increase the leakage current across the IPD of the neighbors (e.g., n+1, n−1) relative to other unselected memory cells. Additionally, the lower the beginning potential of a memory cell's FG, the greater the potential difference is between the memory cell's FG and CG. Because memory cells that have been programmed to a higher state may have a lower beginning FG potential, they may experience greater IPD leakage. Thus, the IPD leakage read disturb may be worse for memory cells n+1 and n−1 that have been programmed to a higher state.

Tunnel oxide related read disturb may occur due to voltage differences between the FG and the channel of a memory cell. For some devices and states, the greater the FG potential, the greater the amount of this type of read disturb. For example, for some devices, when a memory cell is erased its threshold voltage is negative. Hence, the FG may be at a positive voltage. The channel may be at 0V, at least under certain conditions. If the FG voltage of such an erased memory cell is increased, then the electric field across the tunnel oxide increases. This may result in tunneling across oxide causing more electrons to tunnel into the FG. The net effect is to increase the threshold voltage of the memory cell and shift the erase state memory cells towards the A-state. FIG. 8 depicts tunnel oxide related disturb by the arrows and electrons moving from the channel region to the FG of memory cells n+1 and n−1. The control gate of memory cells n+1/n−1 may have an increased potential resulting from the selected control gate CGn being at 0V. This may in turn increase tunnel oxide related read disturb for memory cells n+1/n−2.

Figure 9:
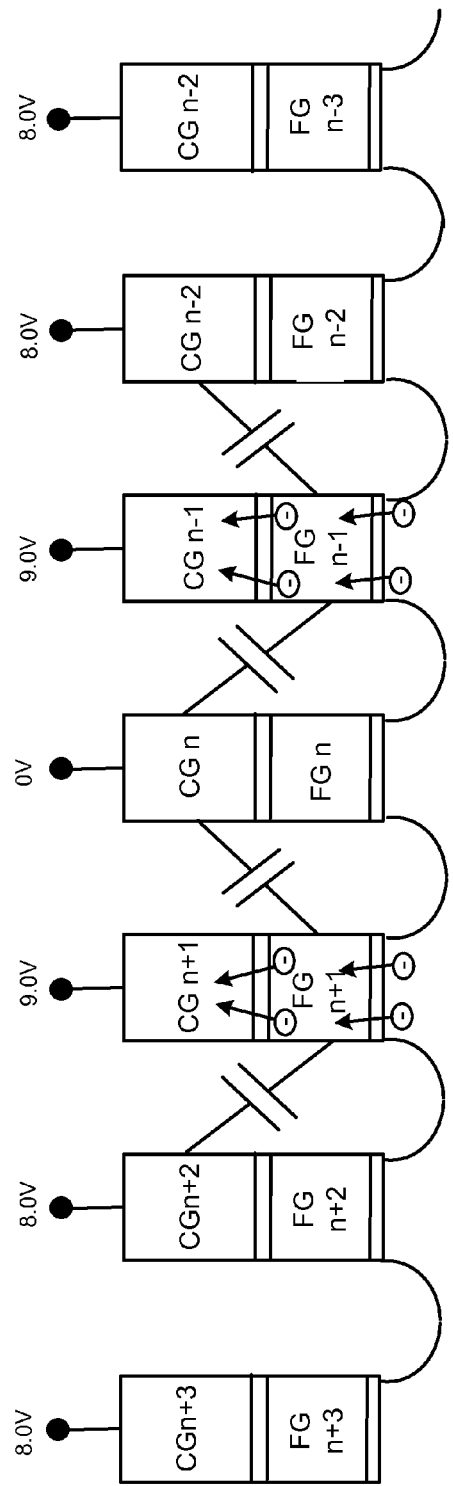
FIG. 9 is a cross-sectional view of a NAND string illustrating the occurrence of read disturb during another biasing for a read operation.

FIG. 9 depicts the NAND string in FIG. 3 with a different set of bias conditions that are often used when reading a selected word line WLn connected to memory cell n. As noted in FIG. 8, during the read operation Vpass may be applied to each unselected memory cell while Vcgrv (e.g., 0V) is applied to the selected memory cell. The lower potential on the selected control gate CGn causes the potential of the neighboring control gates CGn+1/n−1 to be less than that of the other unselected memory cells. This may cause the neighboring memory cells n+1/n−1 to be more difficult to turn on during reading. Accordingly, the bias conditions of FIG. 9 are often used where a larger Vpass is applied to the neighboring word lines WLn+1/n−1 than is applied to the other unselected word lines. In FIG. 9, an example is illustrated where a Vpass of 9.0V is applied to Word lines WLn+1/n−2, while a Vpass of 8.0V is applied to the other unselected word lines.

A result of biasing as shown in FIG. 9, however, is that read disturb may be increased for the memory cells of the neighboring word lines. With an increase in the control gate potential on CGn+1/n−1, the IPD leakage and/or tunnel oxide related disturb may increase. As FIGS. 8 and 9 illustrate, properly biasing the string during reading to avoid read disturb can be a complicated and nuanced task to ensure that the channel of the NAND string is turned on, while avoiding read related disturb on the various memory cells, which are experiencing unequal levels of disturb.

Figure 10:
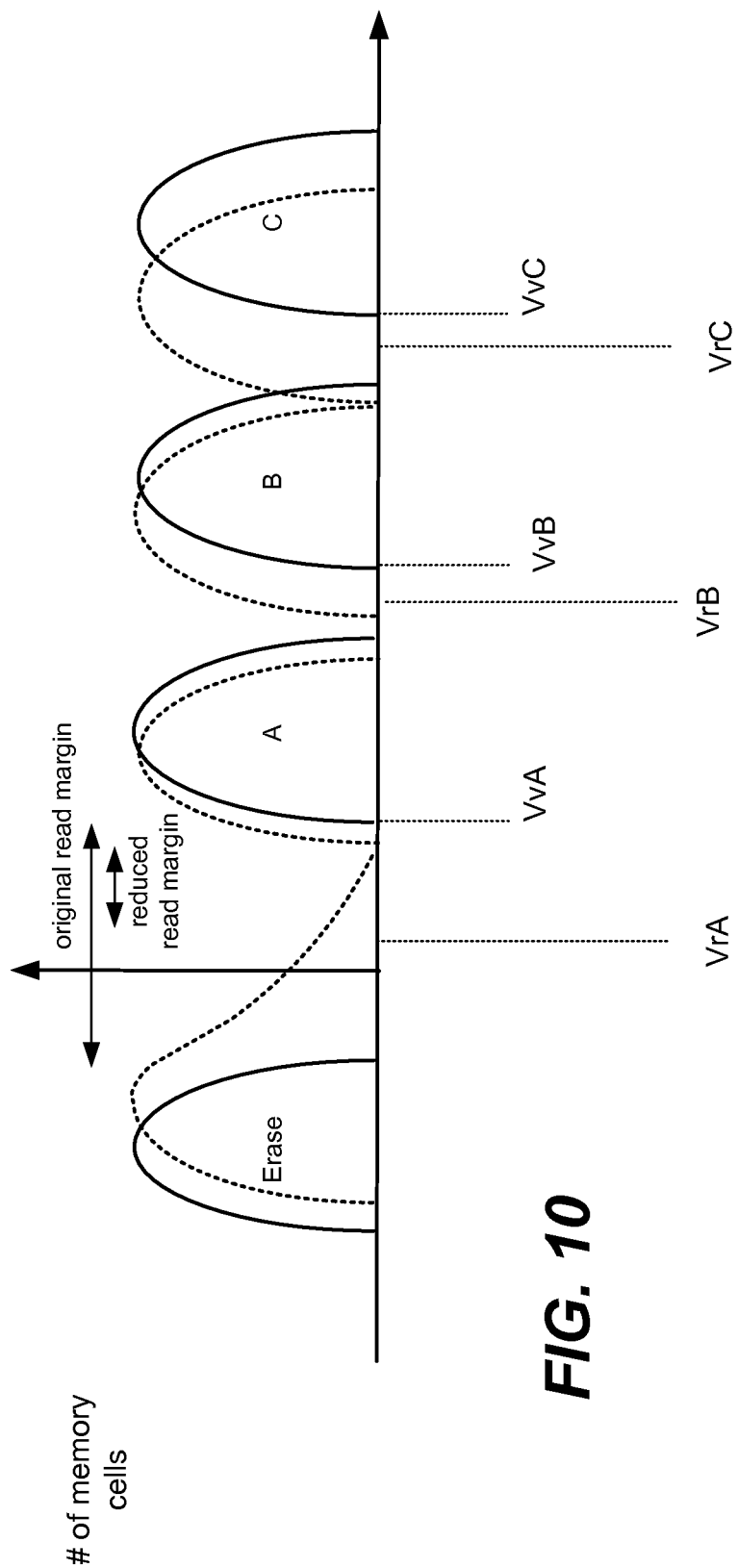
FIG. 10 depicts threshold voltage distributions for a memory cell array and an example of how read disturb may affect the threshold voltage distributions.

FIG. 10 depicts an example of how read disturb may affect the threshold voltage distributions of a set of memory cells. The solid curves correspond to the original distribution of threshold voltage ranges (states). The dashed curves correspond to shifts that may occur after many reads due to read disturb. In this example, the highest state is impacted by read disturb more than the other states. However, for some architectures this might not be the case. In this example, the threshold voltages of the erased memory cells are moved upwards towards the A-state as a result of read disturb. The threshold voltages of the various programmed states, are moved downwards towards the erased state as a result of read disturb. FIG. 10 depicts the original lowest level for the programmed states corresponding to a program verification level VvA, VvB, or VvC. As a result of the shift in the threshold voltages a loss of read margin is experienced. For example, an original read margin between the erased state and state A is illustrated. Also illustrated is the reduced read margin resulting from state A shifting downwards and the erased state shifting upwards.

Figure 11:
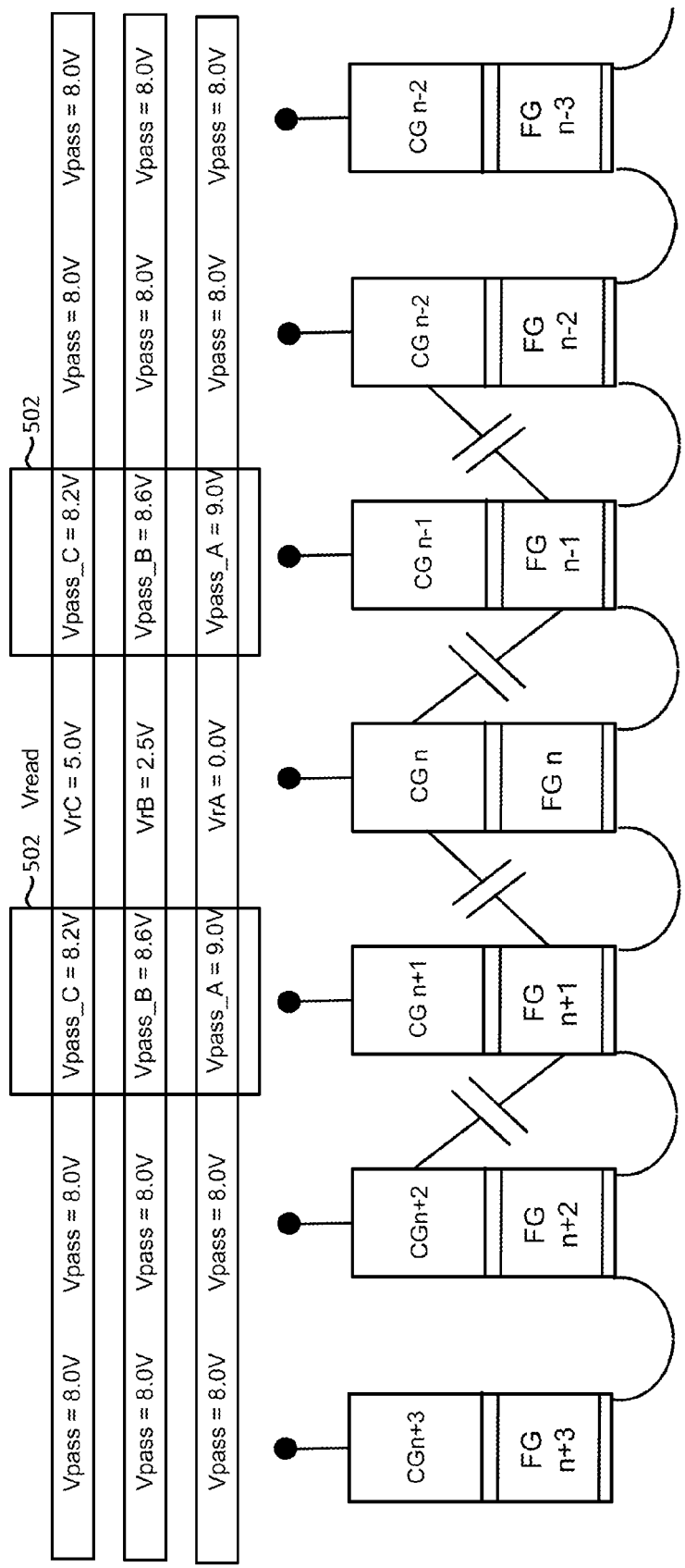
FIG. 11 is a cross-sectional view of a portion of a NAND string depicting bias according to an embodiment with state-dependent read pass voltages.

FIG. 11 is a cross-sectional view of a portion of a string of memory cells illustrating a set of bias conditions in accordance with an embodiment of the disclosure. In FIG. 11, a set 502 of state-dependent read pass voltages is used for the adjacent word lines connected to control gates CGn+1/n−1. FIG. 11 illustrates a typical read operation for a four-state memory device. In this example, read compare voltages VrA, VrB, and VrC are applied to the selected word line connected to control gate CGn, for example as a set of pulses. A default Vpass voltage of 8.0V is applied to the unselected word lines connection to CGn+2/n−2 and CGn+3/n−3. The default pass voltage is applied to these unselected word lines while applying each of the read voltages. For the neighboring word lines, however, the set 502 state-dependent pass voltages is applied. While applying the state A read compare voltage VrA, a data dependent pass voltage Vpass_A is applied to the unselected word lines connected to control gates CGn+1/n−1. While applying the state B read compare voltage VrB, a data dependent pass voltage Vpass_B is applied to control gates CGLn+1/n−1. While applying the state C read compare voltage VrC, a data dependent pass voltage Vpass_C is applied to control gates CGn+1/n−1.

Because each of the other unselected word lines is at 8.0V during application of each read voltage VrA, VrB, and VrC, they can be expected to have a relatively constant potential resulting from the coupling of 8.0V from each of their neighboring word lines (or a relatively high voltage close to 8.0V in the case of WLn+2/n−2). For the neighboring memory cells n+1/n−1, however, their potential will vary with the application of the varying read voltage. Their potential will increase as the read compare voltage is increased for the selected word line. In the example of FIG. 11, VrA is 0V, VrB is 2.5V and VrC is 5.0V. Thus, when VrA is applied to the selected word line, the potential of the control gates for the neighboring word lines WLn+1/n−1 can be expected to be at their lowest point in the read operation. When VrC is applied to the selected word line, the potential of the control gates for the neighboring word lines WLn+1/n−1 can be expected to be at their highest point during the read operation. When VrA is applied, their potential is furthest from the potential of the other unselected word lines and when VrC is applied, their potential is closest to the potential of the other unselected word lines.

Recognizing that the effects of coupling vary for the adjacent memory cells n+1/n−1, the biasing in FIG. 11 uses state-dependent pass voltages for the adjacent word lines to reduce read disturb related effects. At the same time, these state-dependent pass voltages are sufficient to turn on the memory cells n+1/n−1 of the adjacent word lines while reading the selected word line WLn In FIG. 11, when VrA equal to 0V is applied to the selected word line WLn, the low read voltage of 0V pulls down or otherwise causes the potential of CGn+1/n−1 to be low. At this point as earlier described, the potential at CGn+1/n−1 is at its lowest point during reading. Accordingly, a large state-dependent pass voltage Vpass_A is applied. In this example, a 9.0V Vpass_A voltage is applied to word lines WLn+1/n−1 while applying the default Vpass voltage of 8.0V is applied to other unselected word lines. Because the read compare voltage is at its lowest value, a state-dependent pass voltage at the largest value of Vpass_A equal to 9.0V is applied.

When VrB equal to 2.5V is applied to the selected word line WLn, the potential of CGn+1/n−1 of the neighboring memory cells is increased relative to when VrA is applied. At this point, the potential of the neighboring memory cells is closer to that of the other unselected memory cells. Accordingly, the state-dependent pass voltage can be lowered from its value when applying VrA. Because Vread increases, the control gate voltage at n+1/n−1 increases. Accordingly, the value of Vpass needed to turn on the memory cells at WLn+1/n−1 decreases. Accordingly, a data_dependent pass voltage Vpass_B equal to 8.6V is applied to the neighboring word lines WLn+1/n−1.

Similarly, when VrC equal to 5.0V is applied to the selected word line WLn, the potential of CGn+1/n−1 of the neighboring memory cells is again increased relative to when VrA and VrB is applied. At this point, the potential of the neighboring memory cells is closest to that of the other unselected memory cells. Accordingly, the state-dependent pass voltage can be lowered from its value when applying VrA and VrB. Because Vread increases, the control gate voltage at n+1/n−1 increases. Accordingly, the value of Vpass needed to turn on the memory cells at WLn+1/n−1 decreases. Accordingly, a data_dependent pass voltage Vpass_C equal to 8.2V is applied to the neighboring word lines WLn+1/n−1.

It is noted that the exact voltages used in FIG. 11 will vary by implementation. Moreover, the concept may be extended to any number of states used in a non-volatile memory. In general, as the read compare voltage increases, the state-dependent pass voltage may decrease. In this manner, read disturb may be decreased by using a lower read pass voltage for the neighboring memory cells. At the same time, conduction through the neighboring memory cells can still be enabled because of the larger coupling potential from the read compare voltage being applied to the selected word line. It is noted that while the lowest state-dependent pass voltage in FIG. 11, Vpass_C equal to 8.2V, is greater than the default pass voltage of 8.0V, the lowest state-dependent pass voltage may be equal to the default pass voltage in other examples. It is noted that in some implementations, state-dependent pass voltages may be applied to one neighboring word line but not the other. For example, state dependent pass voltages may be applied to n+1 while applying a default pass voltage to n−1 or state dependent pass voltages may be applied to n−1 while applying a default pass voltage to n+1.

Figure 12:
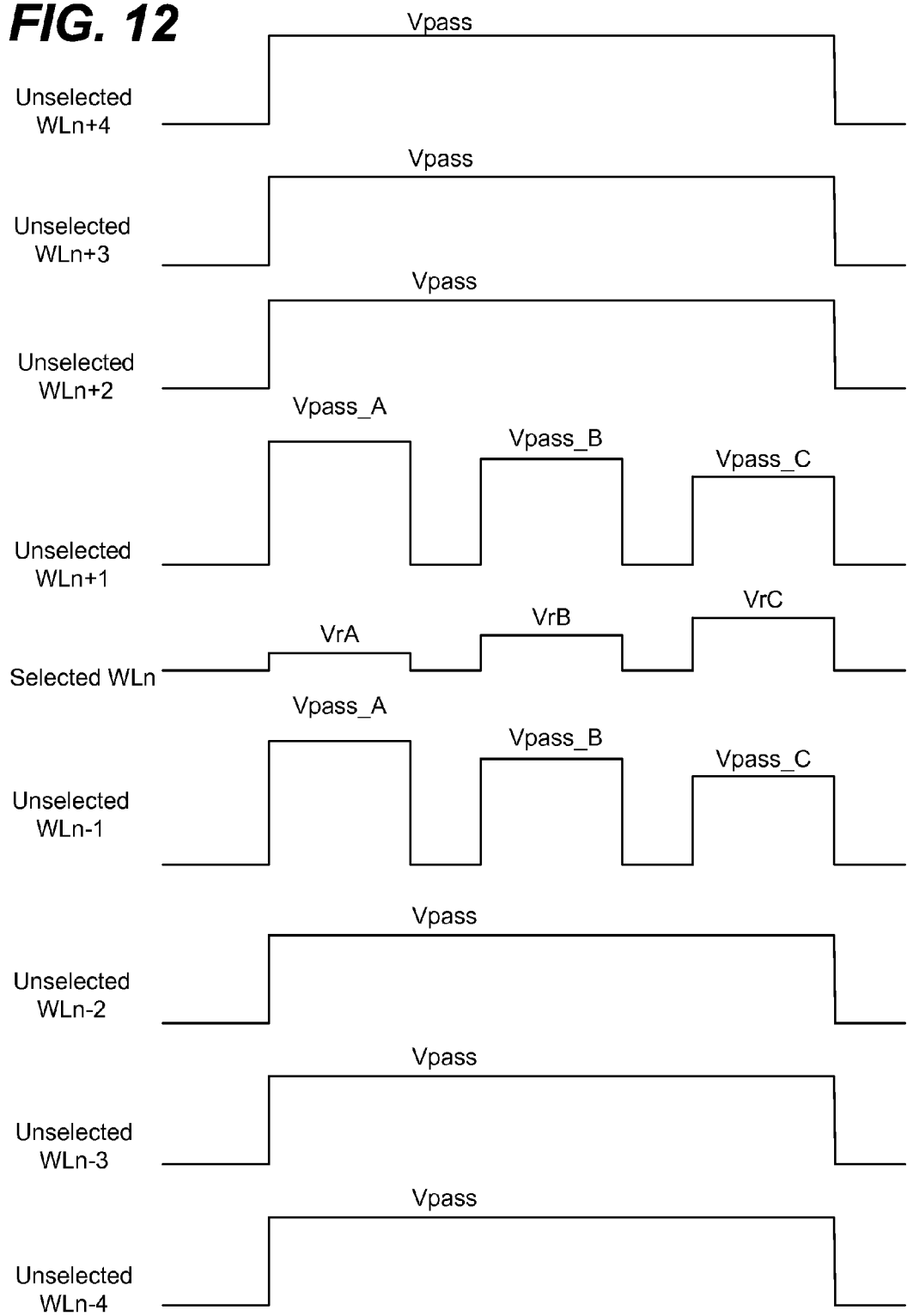
FIG. 12 is a signal diagram depicting voltages applied to a NAND string during a read operation according to an embodiment.

FIG. 12 depicts voltages applied to the word lines during a read operation in accordance with an embodiment using state-dependent pass voltages. Voltages are depicted for a selected word line WLn and eight unselected word lines WLn+1/n−1 through WLn+4/n−4. In this example, the word lines n+m may be closer to the drain side (for example, they may be closer to SGD in FIG. 2). The word lines n−m may be closer to the source side (e.g., SGS). Typically there are many more unselected word lines than depicted in FIG. 12. In some cases, the selected word line may be close to the end of a NAND string, in which case there may be fewer than four neighbors to either the drain or source side.

Three read compare voltages VrA, VrB, and VrC, or just read voltages, are depicted for the selected word line. These may correspond to VrA, VrB, and VrC from FIG. 7B. In this example, these voltages are applied from low to high, but another sequence may be used. Also note that the read operation is not required to apply all of the read compare voltages to the selected word line. For example, if a single page is being read, then possibly only VrB might be applied.

In this embodiment, a default Vpass is applied to unselected word lines WLn+2/n−2 through WLn+4/n−4. The default Vpass is applied to these unselected word lines while applying each of the read voltages VrA, VrB, and VrC. The unselected word lines WLn+1/n−1 that are adjacent to the selected word line WLn, however, have state-dependent pass voltages applied to them based on the value of the read compare voltage being applied to the selected word line. As illustrated, Vpass_A is applied to WLn+1/n−1 while applying VrA to the selected word line. Vpass_B is applied to WLn+1/n−1 while applying VrB, and Vpass_C is applied to WLn+1/n−1 while applying VrC. Vpass_A is greater than Vpass_B and Vpass_B is greater than Vpass_C. In this manner, the state-dependent pass voltage is decreased for the adjacent word lines as the read compare voltage is increased for the selected word line. It is noted that reading may be performed in other orders such that the read compare voltage is decreased while the state-dependent pass voltage is increased. By adjusting the pass voltage of the adjacent word lines based on the read compare voltage, the potential of these memory cells can be more closely biased to the levels of the other unselected memory cells. In this manner, read disturb on the adjacent memory cells may be decreased. Moreover, this can be done while maintaining the adjacent memory cells in a turned on condition so that the read operation can be properly performed with conduction through the NAND string.

As earlier described, where more than four states are used, more than four state-dependent pass voltages may be used. Furthermore, there may be state-dependent pass voltages for only a subset of all of the read voltages. For example, at higher level states, the state-dependent pass voltage for memory cells n+1/n−1 may be reduced to the level of the default pass voltage Vpass.

Figure 13:
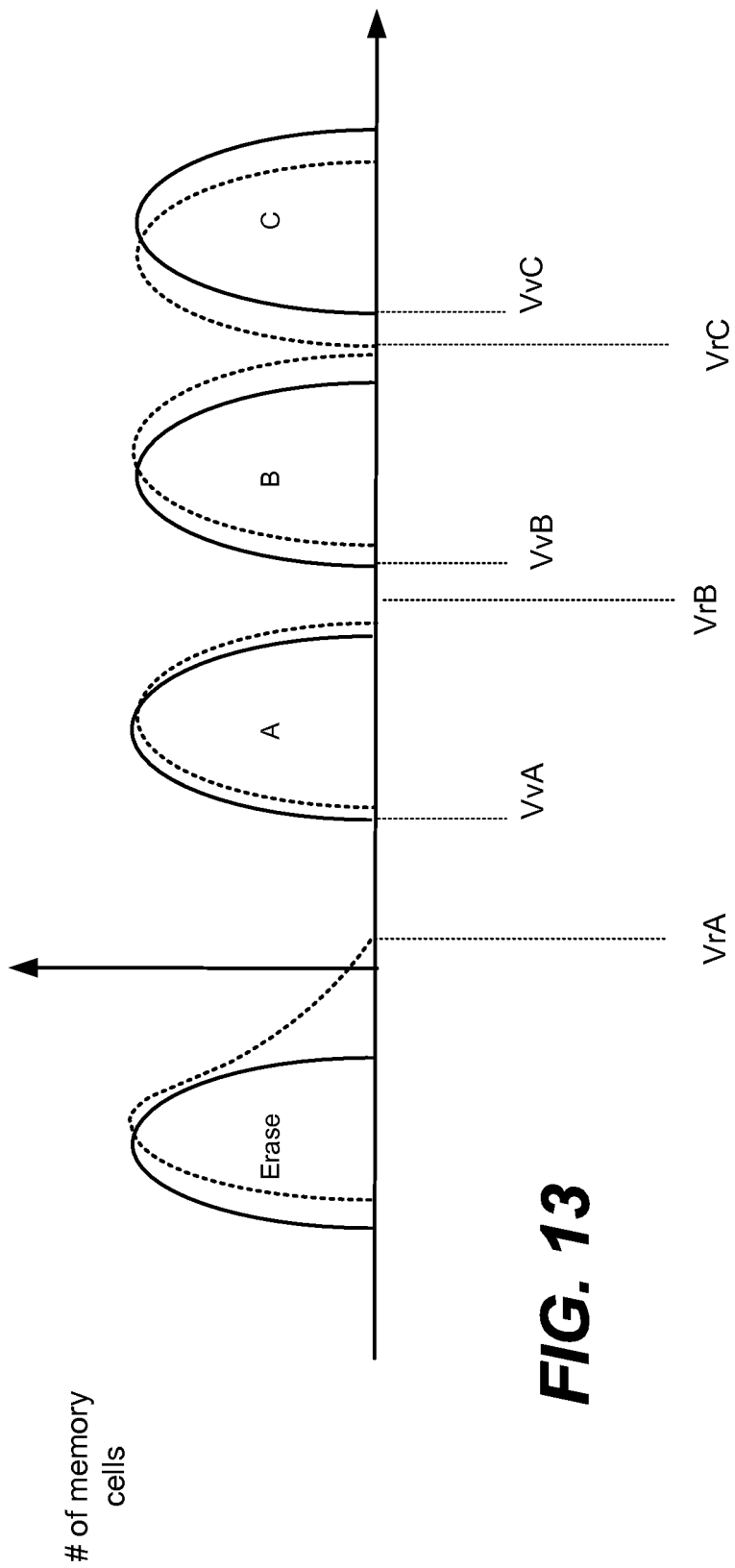
FIG. 13 depicts threshold voltage distributions for a memory cell array and an example of how read disturb may be reduced.

FIG. 13 depicts an example of threshold voltage distributions of a set of memory cells when read using a set of state-dependent pass voltages for adjacent word lines. The solid curves correspond to the original distribution of threshold voltage ranges (states). The dashed curves correspond to shifts that may occur after many reads due to read disturb. As illustrated, the shifts in threshold voltage are less in FIG. 13 than in FIG. 10 when standard or default pass voltages are used. The erased states and states A and B, while shifted in the positive threshold voltage direction, do not experience as large a shift. State C shifts in the negative threshold voltage direction, but not as significantly as in FIG. 10. The directional shifts of the erased state and states A and B in the positive direction may result from charge gain. A smaller loss of read margin is experienced when compared to FIG. 10.

Figure 14:
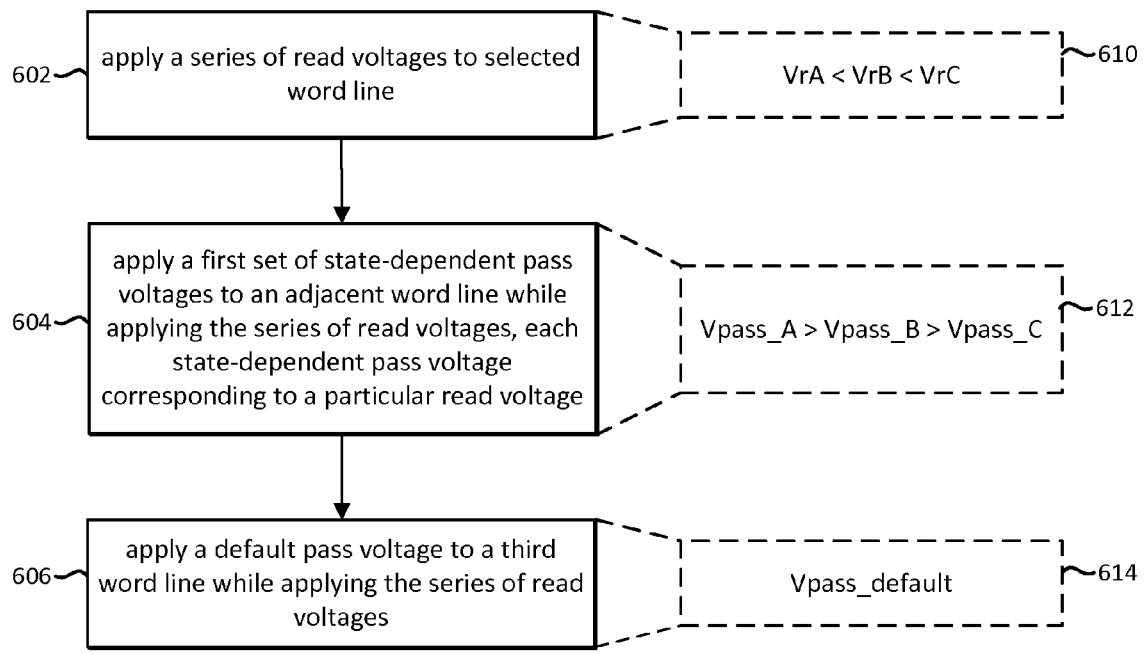
FIG. 14 is a flowchart describing a process of reading non-volatile memory according to an embodiment.

FIG. 14 is a flowchart describing a portion of read operation using state-dependent pass voltages in accordance with one embodiment. Note that no order should be implied from the order in which the steps are performed. Indeed the steps will generally be performed at the same time and iteratively as different read compare voltages are applied.

At step 602, a series of read voltages are applied to a selected word line. As box 610 illustrates, read voltages VrA, VrB, and VrC can be applied in one example, where VrA is less than VrB and VrB is less than VrC. It is noted, however, that any number of read voltages may be applied at step 602.

At step 604, a first set of state-dependent pass voltages are applied to a word line that is adjacent to the selected word line. The set of state-dependent pass voltages is applied while applying the series of read voltages. Specifically, a unique pass voltage for each corresponding read voltage is applied. For example, Vpass_A may be applied while applying VrA to the selected word line, Vpass_B may be applied while applying VrB, and Vpass_C may be applied while applying VrC. As box 612 illustrates, Vpass_A is greater than Vpass_B and Vpass_B is greater than Vpass_C. In this manner, the state-dependent pass voltage is decreased as the read compare voltage applied to WLn is increased. As such, the read disturb on the memory cells of the adjacent word line may be decreased while maintaining those memory cells in a conductive state for sensing. Step 604 may include applying the state-dependent pass voltages to more than one adjacent word line, such as by applying the state-dependent pass voltages to WLn+1 and WLn−1. In fact, state-dependent pass voltages that are the same or different to those applied to WLn+1 and WLn−1 may be applied to other unselected word lines such as WLn+2 and WLn−2.

At step 606, a default pass voltage is applied to a third word line. The set of one or more pass voltages are applied while applying the first set of state-dependent pass voltages and the read voltages. In one example, the set of one or more pass voltages includes a single pass voltage, for example that it is equal to the default pass voltage Vpass_default as shown in box 614. In other example, a set of one or more pass voltages can include more than one pass voltage, for example, that includes other state-dependent pass voltages, for example. In one example Vpass_A and Vpass_B are greater than Vpass_default, while Vpass_C is greater than or equal to Vpass_default. If more than three read compare voltages are used, additional state-dependent pass voltages can be used. The additional state-dependent pass voltages can be decreased as the read compare voltage is increased.

Figure 15:
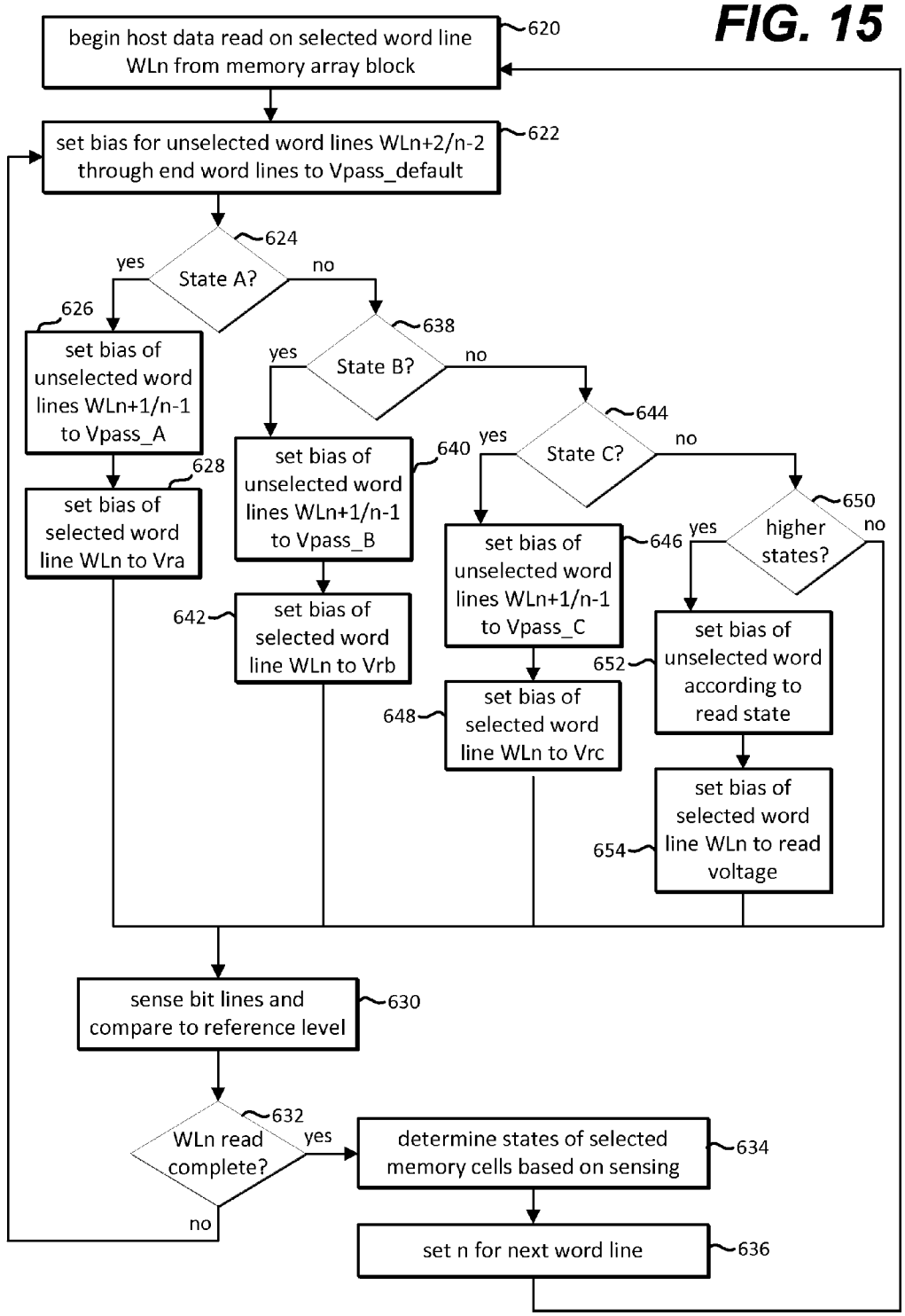
FIG. 15 is a flowchart describing an example of an implementation for reading non-volatile memory according to an embodiment.

FIG. 15 is flowchart describing details of a read operation, as can be performed by controller 246 in one example. Note that no order should be implied from the order in which the steps are performed. At step 620, the controller begins a host data read operation on a selected word line WLn from a memory block. At step 622, the controller sets the bias for unselected word lines WLn+2/n−2 through the end word lines to a default read pass voltage Vpass_default. At step 624, the controller determines whether the next state to be read from the memory array is State A. If the next state is State A, the controller sets the bias of the unselected word lines WLn+1/n−1 to Vpass_A at step 626. The controller sets the bias of the selected word line WLn to VrA at step 628. The pass voltage Vpass_A and VrA both correspond or are otherwise associated with State A. Generally the value of Vpass_A can be chosen to optimize read disturb considerations and considerations of proper conductive biasing through the string for sensing. Generally, where VrA is a relatively low value read voltage, the value of Vpass_A can be a relatively high value pass voltage, as compared to other pass voltages.

At step 630, the bit lines of the selected memory block are sensed and compared with a reference level (e.g., current or voltage). The results of sensing may be stored in data latches for example. At step 632, the controller determines whether reading for the selected word line is complete. If there are additional states to sense for example, the process returns to step 622 to set the bias conditions for the unselected word lines WLn+2/n−2 through the end word lines.

If it is determined that the current state is not State A at step 624, the controller determines whether the next state to be read is State B at step 638. If the next state to be read is State B, the controller sets the bias of the unselected word lines WLn+1/n−1 to Vpass_B at step 640. The controller sets the bias of the selected word line WLn to VrB at step 642. The pass voltage Vpass_B and VrB both correspond or are otherwise associated with State B. Vpass_B can be chosen to optimize considerations when reading at the VrB compare level. If VrB is a middle level read voltage, Vpass_B can be a middle level pass voltage. At step 630, the bit lines are sensed under the biasing for State B.

If it is determined that the current state is not State B at step 638, the controller determines whether the next state to be read is State C at step 644. If the next state to be read is State C, the controller sets the bias of the unselected word lines WLn+1/n−1 to Vpass_C at step 646. The controller sets the bias of the selected word line WLn to VrC at step 648. The pass voltage Vpass_C and VrC both correspond or are otherwise associated with State C. Vpass_C can be chosen to optimize considerations when reading at the VrB compare level. If VrC is a high level read voltage, Vpass_C can be a low level pass voltage. At step 630, the bit lines are again sensed under the biasing for State C.

If it is determined that the current state is not State C at step 644, the controller determines whether there are higher level states to be read step 650. If there are additional states, the controller sets the bias of the unselected word lines WLn+1/n−1 to a read pass voltage at step 652 corresponding to the state being read. The controller sets the bias of the selected word line WLn to the appropriate read compare voltage at step 654. At step 630, the bit lines are sensed under the biasing for the higher level state. As FIG. 15 illustrates, state dependent read pass voltages may be used for any number of states. In this manner, the controller provides state-dependent biasing of the neighboring word lines WLn+1/n−1 based on the state being sensed on the selected word line WLn.

Once the controller determines that the word line WLn read is complete, the states of the selected memory cells are determined at step 634 based on the result(s) of sensing at step 630. At step 636, the controller sets the value of n for the next word line to be read at step 620.

Figure 16:
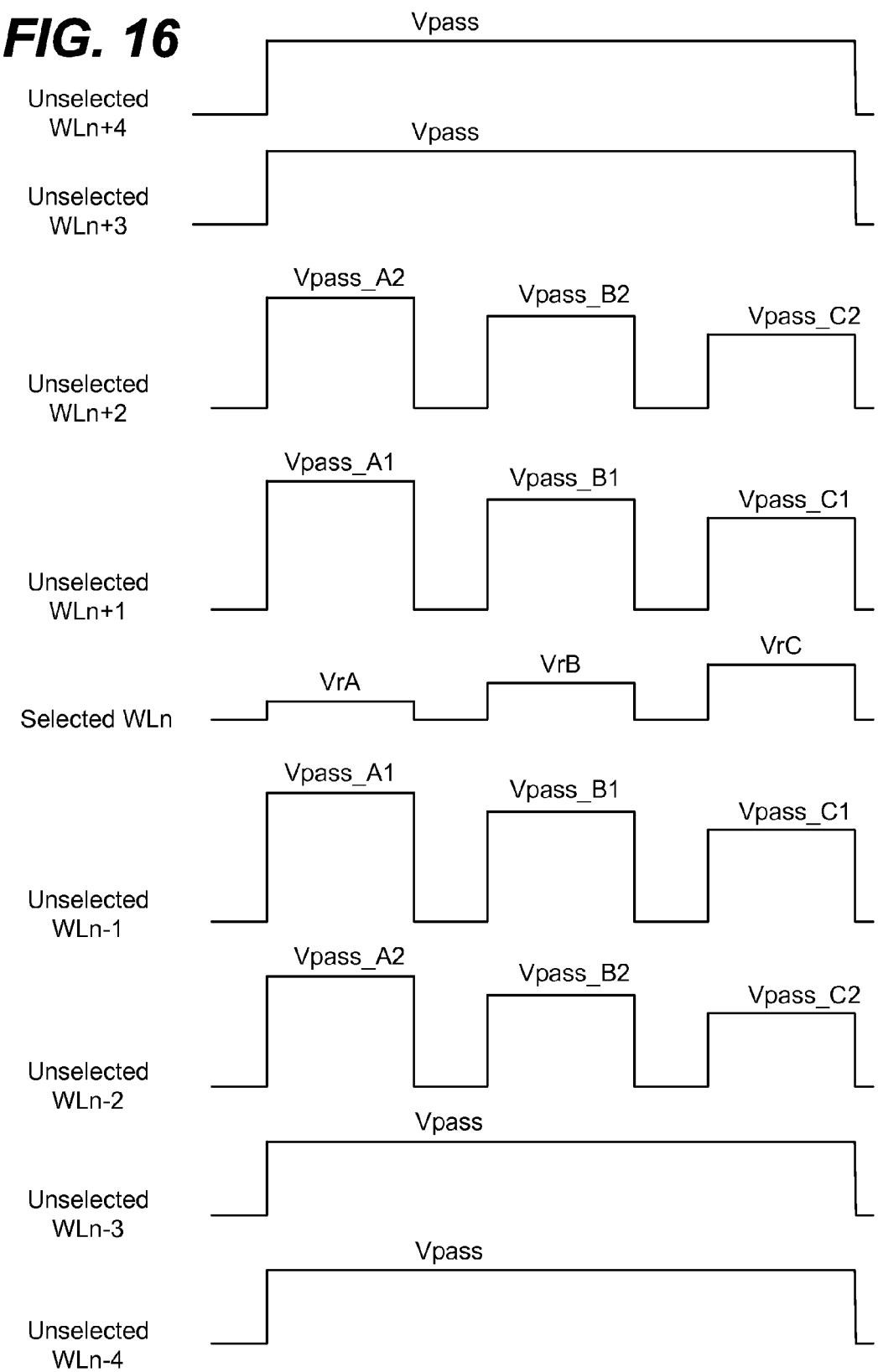
FIG. 16 is a signal diagram depicting voltages applied to a NAND string during a read operation according to an embodiment.

FIG. 16 depicts voltages applied to the word lines during a read operation in accordance with another embodiment using state-dependent pass voltages. Three read compare voltages VrA, VrB, and VrC are depicted for the selected word line. The voltages are applied from low to high, but another sequence may be used and fewer or additional read compare voltages may be applied as earlier noted.

The default pass voltage Vpass is applied to unselected word lines WLn+3/n−3 through WLn+4/n−4 while applying each of the read compare voltages VrA, VrB, and VrC. The unselected word lines WLn+1/n−1 have state-dependent pass voltages Vpass_A1, Vpass_B1, and Vpass_C1 applied to them. In this embodiment, the word lines that are adjacent to word lines WLn+1/n−1 also have state-dependent pass voltages applied to them. The second set of state-dependent voltages are denoted Vpass_A2, Vpass_B2, and Vpass_C2. Vpass_A2 is greater than Vpass_B2, and Vpass_B2 is greater than Vpass_C2. As with the pass voltages for word lines WLn+1/n−1, these voltages are decreased as the read compare voltage is increased for the selected word line. In one embodiment, Vpass_A2 is less than Vpass_A1, Vpass_B2 is less than Vpass_B1, and Vpass_C2 is less than Vpass_C1. The voltages may be selected in this manner since there may be lower coupling to the memory cells proceeding away from the selected word line. Other variations of the voltages levels may be used. For example, it may selected to use the same pass voltage for word lines WLn+1/n−1 and WLn+2/n−2. For example the values for Vpass_C1 and Vpass_C2 might be the same. Moreover, they may be equal to Vpass in one example. As earlier described, additional pass voltages may be used where additional states are being sensed. As with the earlier examples, the values for WLn+2 and WLn−2 may vary or one may receive a state-dependent pass voltage while one receives a default pass voltage.

It is also noted that state-dependent pass voltages may be used for any number of word lines, including all of the word lines in a block. For example, pass voltages Vpass_A3, Vpass_B3, Vpass_C3 etc. may be used for word lines WLn+3/n−3. The values of these pass voltages may be the same or different than the values applied to word lines WLn+2/n−2. Generally, the value of the read pass voltages is chosen to be smaller for word lines further from the selected word line. In this manner, progressively smaller values may be used for the word lines proceeding out from the selected word line. It is noted that the pass voltage scheme may be extended to any number of word lines. For example, word lines WLn+1 to WLn+m and word lines WLn−1 to WLn−k may all be biased based on state. Moreover, the values of m and k do not need to be equal and the values applied on either side of the selected word line do not need to be equal.

The techniques of read disturb management outlined above may be used with additional techniques to provide further control and reduction of read disturb in the memory system. In one embodiment, state-dependent pass voltages are applied selectively based on the data being stored in neighboring word lines. For example, when a word line is storing so-called garbage or otherwise invalid data, standard pass voltages may be applied when sensing for another selected word line. When the word line is storing valid data, however, state-dependent biasing can be used. Controller 244 maintains validity data 262 using RAM 264 in one embodiment.

Figure 17:
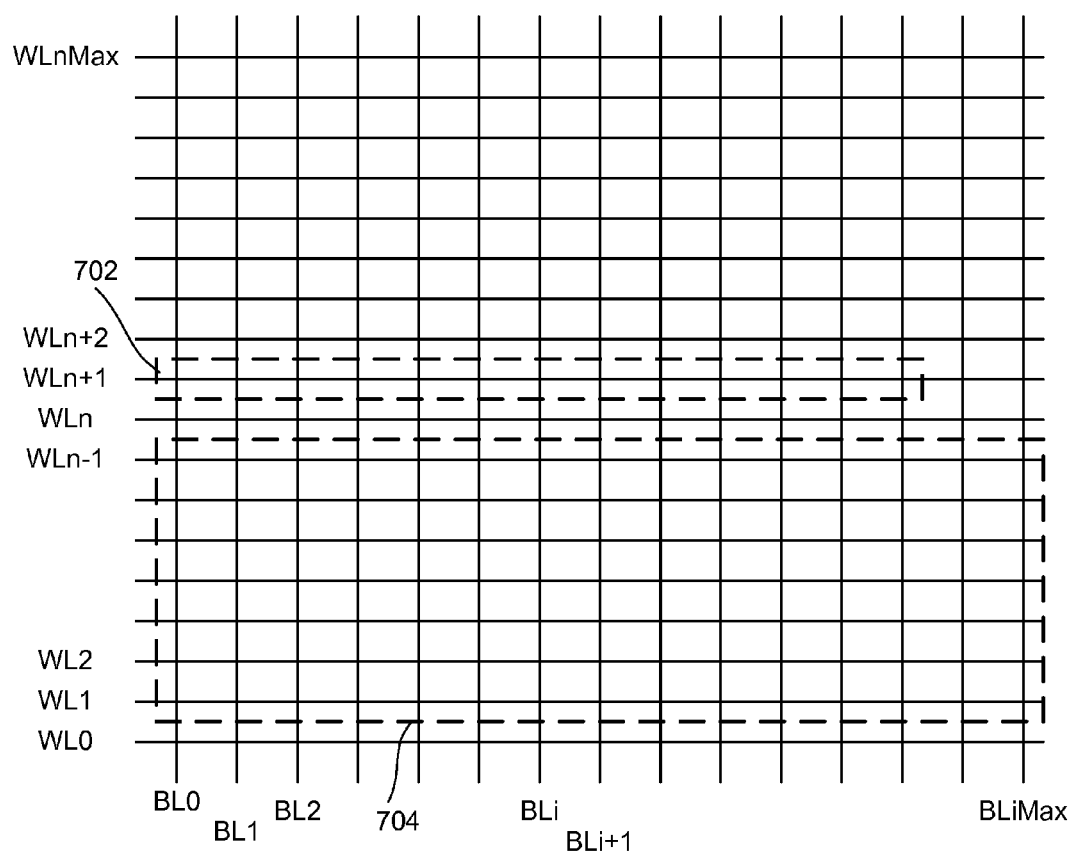
FIG. 17 is a simplified diagram of a memory cell block illustrating garbage collection and invalid data.

FIG. 17 depicts a simplified view of a memory block 200, as shown in FIG. 5 for example. In this example, the data for a first file 702 has been written to a portion of the memory block and data for a second file 704 has been written to another portion of the memory block. Word line WLn represents a selected word line undergoing a read operation. The first file 702 occupies a portion of word line WLn+1 and the second file 704 occupies all of word line WLn−1. In some instances, the data for one or more files may become invalid or deemed garbage. For example, the data for file 702 may be changed by the host, causing the memory system to rewrite the data for file 702 to another location in the memory array. The file in memory block 200, however, is not erased because the data for file 704 may remain valid. For example, some memory systems re-write valid data of memory blocks when a certain portion of the data for a memory block becomes invalid. In this manner, invalid data may be maintained for some time before being erased.

If the controller determines that the data for file 702 in memory block 200 is invalid, it may apply standard read pass voltages, as depicted in FIG. 8 or FIG. 9 for example. Because the data is invalid, read disturb on WLn+1 may not be a concern. Accordingly, a standard read pass voltage can be applied. In one example, the highest pass voltage can be applied. Because the data is invalid, a relatively high value pass voltage may be applied when sending at all states, for example. If the data for file 704 remains valid, the controller can apply state-dependent pass voltages to WLn−1.

Figure 18:
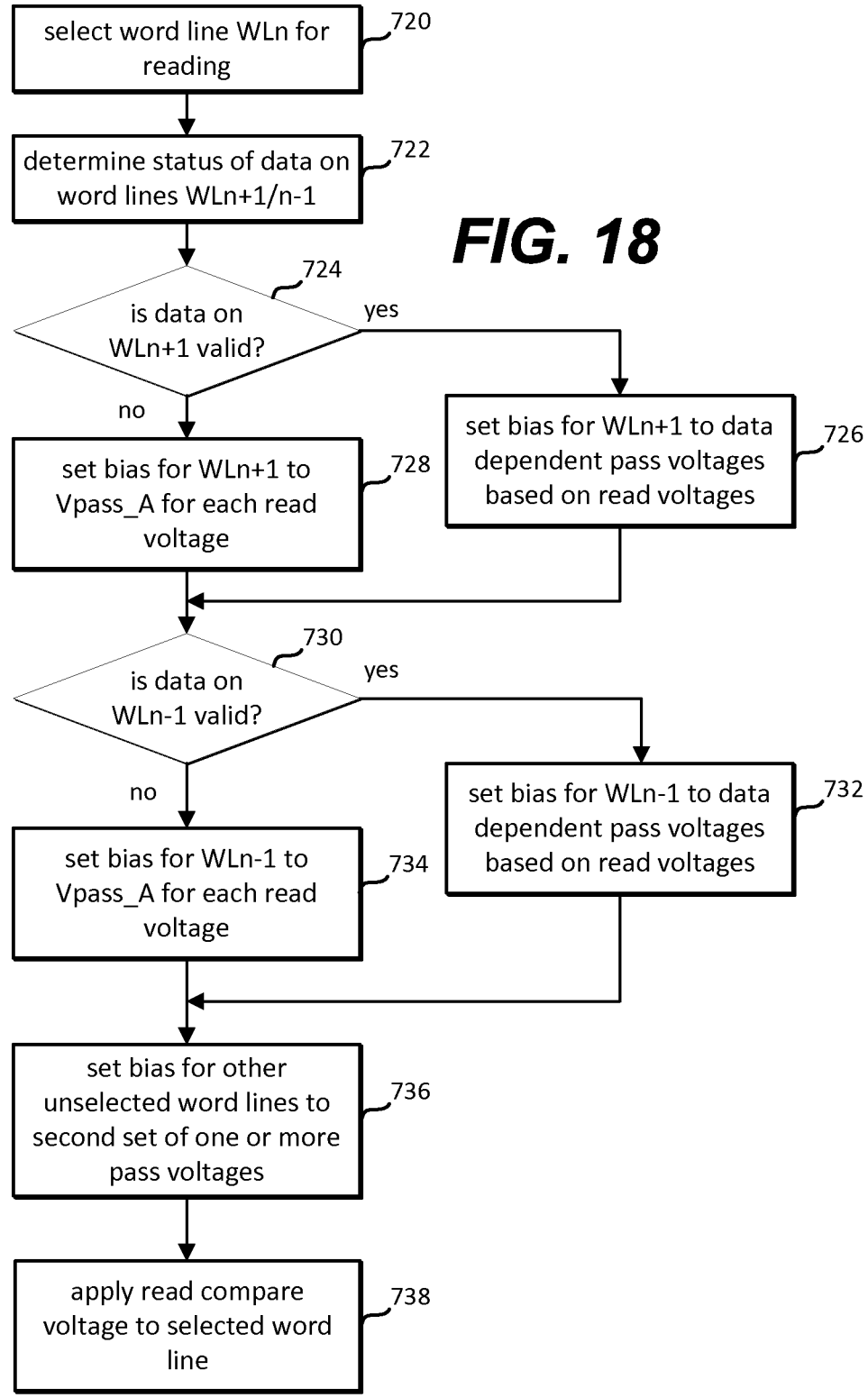
FIG. 18 is a flowchart describing a process of reading non-volatile memory that selectively applies state-dependent pass voltages.

FIG. 18 is a flowchart describing a process of applying selectively applying state-dependent pass voltages when reading non-volatile memory in one embodiment. In one example, the process of FIG. 18 can be performed by controller 216. At step 720, a word line WLn is selected for reading. At step 722, the status of the data on word lines WLn+1/WLn−1 that are adjacent to the selected word line is determined Step 722 may include determining that status of data for other word lines, for example where a technique like that of FIG. 16 is used.

At step 724, the controller determines if the data for WLn+1 is valid. If the data is valid, the controller sets the bias for WLn+1 using state-dependent pass voltages based on the state being read. If the data for WLn+1 is not valid, the controller sets the bias for WLn+1 to a default read pass voltage. In this example, a high level pass voltage Vpass_A is used but other values such as Vpass could be used.

At step 730, the controller determines if the data for WLn−1 is valid. If the data is valid, the controller sets the bias for WLn−1 using state-dependent pass voltages based on the state being read at step 732. If the data for WLn−1 is not valid, the controller sets the bias for WLn+1 to a default read pass voltage at step 734. After biasing the adjacent word lines, the bias for other unselected word lines is set to a second set of one or more pass voltages at step 736. For example, a default pass voltage can be used. At step 738, a read compare voltage is applied to the selected word line and the bit lines are sensed. Steps 724-738 may be repeated as shown in FIG. 15 until sensing for each potential state is completed.

The techniques of read disturb management outlined above may be used with additional techniques to provide further control and reduction of read disturb in the memory system. In one embodiment, state-dependent pass voltages are applied based on cycling of the non-volatile memory. For example, the controller may track the number of write/erase cycles of each memory block of the system. Values or levels for the various state-dependent pass voltages may be determined based on the write/erase cycle history of the memory blocks. As shown in FIG. 4, controller 244 is in communication with a counter 270. Counter 270 may track the number of write/erase cycles for each memory block during a current power cycle. The controller 244 maintains the write/erase cycle history of the memory blocks of the memory systems life as cycle data that can be stored using RAM 264 and portion of the memory array 200. Generally, the controller 244 may lower the state-dependent pass voltages as a memory block undergoes more and more write/erase cycles. As defects are formed in the device, it may become easier to induce coupling. Accordingly, the controller may lower the levels of the state-dependent pass voltages after threshold numbers of write/erase cycles.

Figure 19:
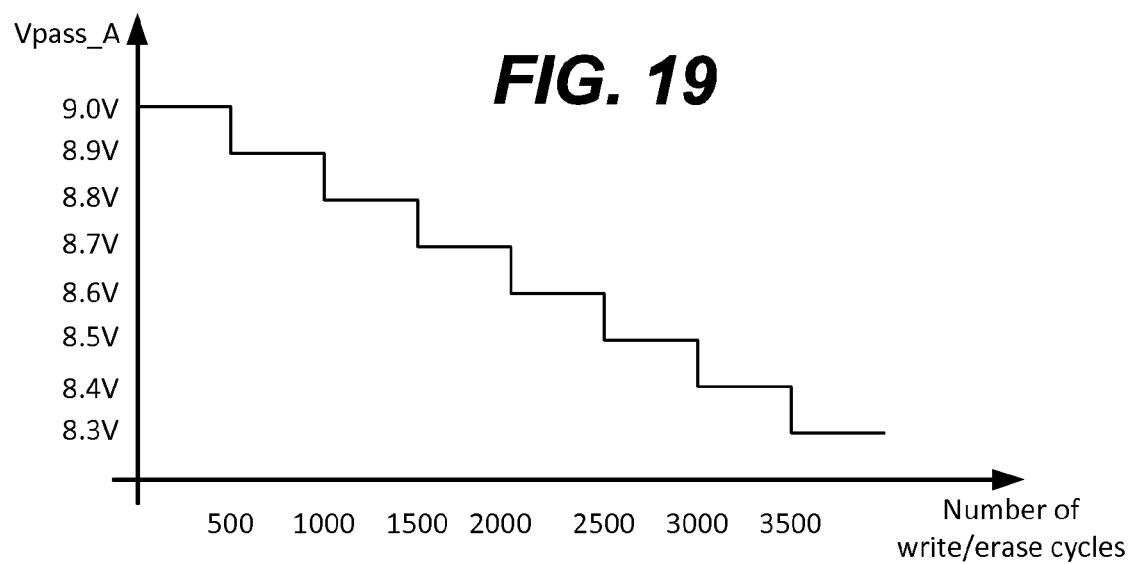
FIG. 19 is a chart depicting an example of a changing state-dependent pass voltage as a function of the memory cells' write and erase cycles.

FIG. 19 is a chart illustrating an example of the level for a state-dependent pass voltage Vpass_A over a device's lifecycle. In this example, the value of Vpass_A begins at 9.0V when the device is fresh or has undergone no write/erase cycles. After 500 write/erase cycles, the value is decreased by 0.1V to 8.9V. This 0.1V increment drop in Vpass_A continues after every 500 write/erase cycles. Note that the values depicted are examples only. In other implementations, the values may be applied in unequal increments at unequal intervals, for example.

Figure 20:
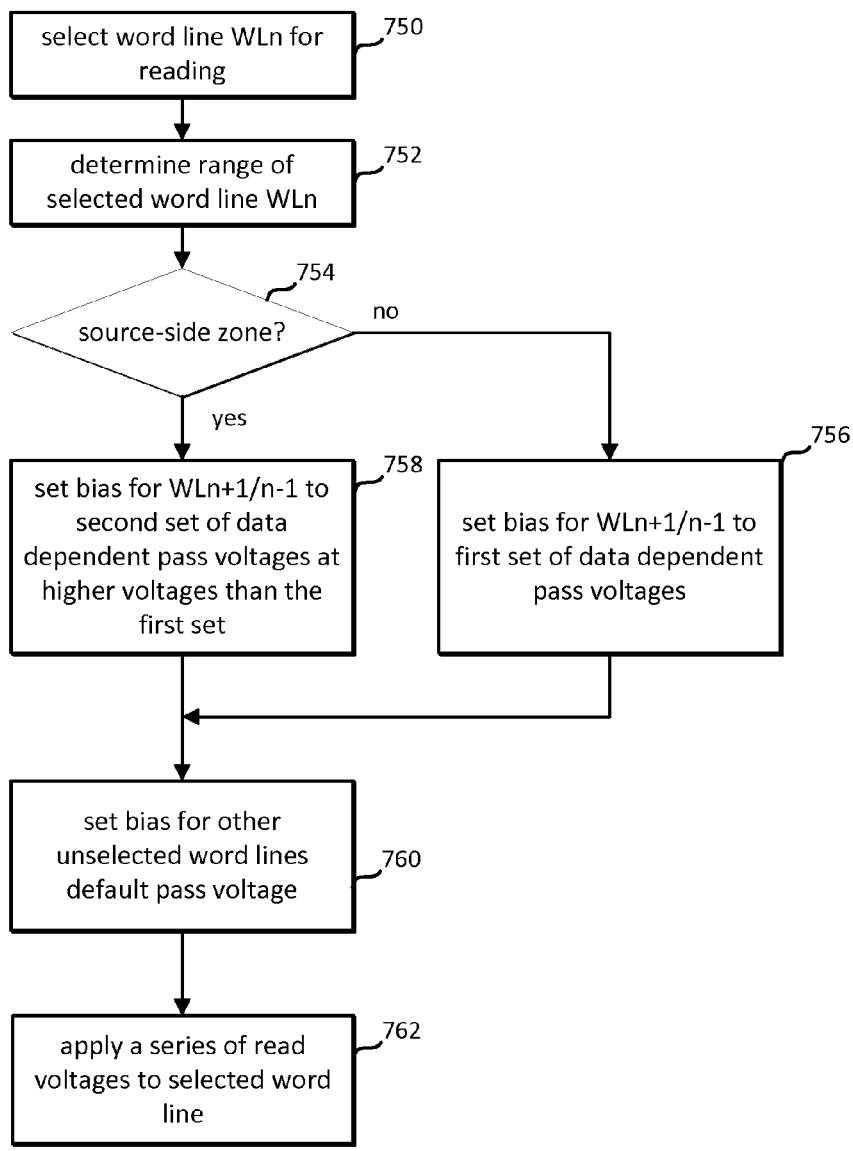
FIG. 20 is a flowchart describing an example of applying state-dependent pass voltages based on the location of a selected word line.

FIG. 20 is a flowchart describing another technique non-volatile memory to manage read disturb. The position of the selected word line can be used to select values of the state-dependent pass voltages in one embodiment. For example, the current in the channel of a NAND string may tend to be smaller at the source-side of the string than at the drain side of the string. In one example, the controller manages the pass voltage levels based on the position of the selected word line relative to the source.

At step 750, a word line WLn is selected for reading. At step 752, the controller determines the zone or position of the selected word line. For example, one system may divide the string into two zones, with a drain-side zone being half of the word lines closer to the drain side and a source-side zone being the half of the word lines closer to the source. It is noted that any number of zones can be used including zones that include only a single word line.

At step 754, the controller determines whether the selected word line WLn is in the source-side zones. If the selected word line WLn is not in the source-side zone, the controller sets the bias for word lines WLn+1/n−1 to a first set of state-dependent pass voltages at step 756. If the selected word line is in the source-side zone, the controller sets the bias for word lines WLn+1/n−1 to a second set of state-dependent pass voltages at step 758. The second set of state-dependent pass voltages are at higher voltages levels than the first set of state-dependent pass voltages. Because the current may be smaller at the source-side, the larger voltages may compensate for the smaller currents at the source side. Likewise, the smaller voltages at the drain-side may compensate for the larger currents at the drain side. It is noted that larger voltages may be used for a subset of the state-dependent pass voltages in place of all the pass voltages. For example, larger voltages may be used for Vpass_A, while the same pass voltages are used for Vpass_B and Vpass_C.

Although word lines WLn+1/n−1 are shown in FIG. 20, any number of word lines can have their state-dependent pass voltages selected based on the position of the selected word line. After biasing the adjacent word lines, the bias for other unselected word lines is set to the default pass voltage at step 760. At step 762, a read compare voltage is applied to the selected word line and the bit lines are sensed. Steps 754-762 may be repeated as shown in FIG. 20 until sensing for each potential state is completed.

Accordingly, there has been described a method for reading non-volatile memory that includes applying a set of read voltages to a selected word line as part of reading data from a set of non-volatile storage elements coupled to the selected word line. The set of read voltages can include a first read voltage, a second read voltage, and a third read voltage. The method includes applying to a first unselected word line that is adjacent to the selected word line a first set of state-dependent pass voltages including a first pass voltage that is applied while applying the first read voltage, a second pass voltage that is applied while applying the second read voltage, and a third pass voltage that is applied while applying the third read voltage. The first read voltage is less than the second read voltage and the second read voltage is less than the third read voltage. The first pass voltage is greater than the second pass voltage and the second pass voltage is greater than the third pass voltage. The method further includes applying to a second unselected word line a fourth pass voltage corresponding to the set of three or more read voltage. The fourth pass voltage is less than the first pass voltage and the second pass voltage. The fourth pass voltage is less than or equal to the third pass voltage.

There has also been described a method of operating non-volatile storage including a plurality of strings of serially-connected non-volatile storage elements. The method includes applying a first read voltage and a second read voltage to a selected word line. The selected word line is coupled to a selected non-volatile storage element on a first of the plurality of strings. The second read voltage is greater than the first read voltage. the method includes applying a first pass voltage to a first unselected word line adjacent to the selected word line while applying the first read voltage to the selected word line and applying a second pass voltage to the first unselected word line while applying the second read voltage to the selected word line. The first unselected word line is coupled to a first unselected non-volatile storage element on the first string. The second pass voltage is less than the first pass voltage. The method includes applying a third pass voltage to a second unselected word line adjacent to the first unselected word line while applying the first pass voltage to the first unselected word line and the second read compare voltage to the selected word line. The second unselected word line is coupled to a second unselected non-volatile storage element on the first string. The third pass voltage is less than the first pass voltage and is less than or equal to the second pass voltage.

A non-volatile storage device has been described that includes a plurality of strings of serially-connected non-volatile storage elements and a plurality of word lines where each word line is coupled to one non-volatile storage element of each of the plurality of strings. The non-volatile storage devices includes a controller in communication with the plurality of strings and the plurality of word lines. The controller biases a selected word line during reading using a first read voltage, a second read voltage, and a third read voltage. The controller biases a first unselected word line that is adjacent to the selected word line using a first pass voltage that is applied while applying the first read voltage, a second pass voltage that is applied while applying the second read voltage, and a third pass voltage that is applied while applying the third read voltage. The controller biases a second unselected word line using a fourth pass voltage that is applied while applying the first read voltage, the second read voltage, and the third read voltage. The fourth pass voltage is less than the first pass voltage and the second pass voltage, the fourth pass voltage is less than or equal to the third pass voltage.

The foregoing detailed description has been presented for purposes of illustration and description. It is not intended to be exhaustive or to limit the disclosed technology to the precise forms disclosed. Many modifications and variations are possible in light of the above teaching. The described embodiments were chosen in order to best explain the principles of the disclosed technology and its practical application to thereby enable others skilled in the art to best utilize the disclosed technology in various embodiments and with various modifications as are suited to the particular use contemplated. It is intended that the scope of the application be defined by the claims appended hereto.

What is claimed is:

1. A method of reading non-volatile storage, comprising:
applying a set of read voltages to a selected word line as part of reading data from a set of non-volatile storage elements coupled to the selected word line, the set of read voltages including a first read voltage, a second read voltage, and a third read voltage, the first read voltage is less than the second read voltage, and the second read voltage is less than the third read voltage;
determining whether data of a first unselected word line that is adjacent to the selected word line is invalid, wherein the data of the first unselected word line is determined to be invalid in response to a file associated with the data of the first unselected word line being rewritten to another location in the non-volatile storage;
if the data of the first unselected word line is valid, applying to the first unselected word line a first pass voltage while applying the first read voltage, a second pass voltage while applying the second read voltage, and a third pass voltage while applying the third read voltage, the first pass voltage is greater than the second pass voltage and the second pass voltage is greater than the third pass voltage; and
if the data of the first unselected word line is invalid, applying to the first unselected word line the first pass voltage while applying the first read voltage, the second read voltage, and the third read voltage.

2. A method according to claim 1, further comprising:
applying to a second unselected word line that is adjacent to the first unselected word line a fourth pass voltage while applying the first pass voltage, the second pass voltage, and the third pass voltage to the first unselected word line, wherein the fourth pass voltage is less than the third pass voltage.

3. A method according to claim 1, further comprising:
applying to a second unselected word line that is adjacent to the first unselected word line the first pass voltage while applying the first read voltage, the second pass voltage while applying the second read voltage, and the third pass voltage while applying the third read voltage.

4. A method according to claim 1, further comprising:
applying a fourth pass voltage to a second unselected word line that is adjacent to the first unselected word line while applying the first pass voltage to the first unselected word line, the fourth pass voltage being less than the first pass voltage;
applying a fifth pass voltage to the second unselected word line while applying the second pass voltage to the first unselected word line, the fifth pass voltage being less than the second pass voltage and the fourth pass voltage; and
applying a sixth pass voltage to the second unselected word line while applying the third pass voltage to the first unselected word line, the sixth pass voltage being less than the third pass voltage and the fifth pass voltage.

5. A method according to claim 4, further comprising:
applying a seventh pass voltage to a third unselected word line that is adjacent to the second unselected word line while applying the first pass voltage, the second pass voltage, and the third pass voltage, the seventh pass voltage being less than the sixth pass voltage and the third pass voltage.

6. A method according to claim 1, wherein the selected word line is a first selected word line that is part of a memory array block including a source line, the first selected word line is further from the source line than a second selected word line of the memory array block, the method further comprising:
applying the set of read voltages to the second selected word line as part of reading data from a set of non-volatile storage elements coupled to the second selected word line;
applying to a second unselected word line that is adjacent to the second selected word line a fourth pass voltage while applying the first read voltage, a fifth pass voltage while applying the second read voltage, and a sixth pass voltage while applying the third read voltage, the fourth pass voltage is greater than the fifth pass voltage and the first pass voltage, the fifth pass voltage is greater than the sixth pass voltage and the second pass voltage, the sixth pass voltage is greater than the third pass voltage.

7. A method according to claim 1, further comprising:
applying to a second unselected word line that is adjacent to the first unselected word line the third pass voltage, while applying to the first unselected word line the first pass voltage, the second pass voltage, and the third pass voltage.

8. A method according to claim 1, wherein said applying the set of read voltages is part of a first read process, the method further comprising:
determining a number of write/erase cycles of a non-volatile memory including the set of non-volatile storage elements; and
if the number of write/erase cycles is greater than or equal to a threshold number of write/erase cycles of the non-volatile memory, performing a second read process, wherein performing the second read process includes
applying a fourth pass voltage to the first unselected word line while applying the first read voltage to the selected word line, the fourth pass voltage is less than the first pass voltage,
applying a fifth pass voltage to the first unselected word line while applying the second read voltage to the selected word line, the fifth pass voltage is less than the second pass voltage and the fourth pass voltage, and
applying a sixth pass voltage to the first unselected word line while applying the third read voltage to the selected word line, the sixth pass voltage is less than the third pass voltage and the fifth pass voltage.

9. A method according to claim 8, wherein the first read process is performed, if the number of write/erase cycles is less than the threshold number of write/erase cycles of the non-volatile memory.

10. A method according to claim 1, wherein:
the first selected word line, the first unselected word line, and the set of non-volatile storage elements are part of a three-dimensional array of non-volatile storage elements.

11. A non-volatile storage device, comprising:
a plurality of strings of serially-connected non-volatile storage elements;
a plurality of word lines, each word line is coupled to one non-volatile storage element of each of the plurality of strings; and
a controller in communication with the plurality of strings and the plurality of word lines, the controller is configured to bias a selected word line during reading using a first read voltage, a second read voltage, and a third read voltage, the controller is configured to determine whether data of a first unselected word line that is adjacent to the selected word line is invalid by determining whether a file associated with the data of the first unselected word line has been rewritten to another location in the non-volatile storage device;
wherein in response to determining that the data of the first unselected word line is valid, the controller is configured to apply to the first unselected word line a first pass voltage while applying the first read voltage, a second pass voltage while applying the second read voltage, and a third pass voltage while applying the third read voltage, wherein the second pass voltage is less than the first pass voltage and greater than the third pass voltage; and
wherein in response to determining that the data of the first unselected word line is invalid, the controller is configured to apply the first pass voltage to the first unselected word line while applying the first read voltage, the second read voltage, and the third read voltage.

12. A non-volatile storage device according to claim 11, wherein the controller is configured to apply to a second unselected word line that is adjacent to the first unselected word line a fourth pass voltage while applying the first read voltage, the second read voltage, and the third read voltage to the selected word line, the fourth pass voltage is less than the third pass voltage.

13. A non-volatile storage device according to claim 11, wherein:
the controller is configured to apply to a second unselected word line that is adjacent to the first unselected word line the first pass voltage while applying the first read voltage, the second pass voltage while applying the second read voltage, and the third pass voltage while applying the third read voltage.

14. A non-volatile storage device according to claim 11, wherein:
the controller is configured to apply to a second unselected word line that is adjacent to the first unselected word line;
a fourth pass voltage while applying the first pass voltage to the first unselected word line, the fourth pass voltage being less than the first pass voltage;
the controller is configured to apply a fifth pass voltage to the second unselected word line while applying the second pass voltage to the first unselected word line, the fifth pass voltage being less than the second pass voltage and the fourth pass voltage; and
the controller is configured to apply a sixth pass voltage to the second unselected word line while applying the third pass voltage to the first unselected word line, the sixth pass voltage being less than the third pass voltage and the fifth pass voltage.

15. A non-volatile storage device according to claim 11, wherein:
the controller is configured to apply the set of read voltages as part of a first read process;
the controller is configured to determine a number of write/erase cycles of the non-volatile storage device;
if the number of write/erase cycles is greater than or equal to a threshold number of write/erase cycles of the non-volatile memory, the controller is configured to perform a second read process by applying a fourth pass voltage to the first unselected word line while applying the first read voltage to the selected word line, applying a fifth pass voltage to the first unselected word line while applying the second read voltage to the selected word line, and applying a sixth pass voltage to the first unselected word line while applying the third read voltage to the selected word line; and the fourth pass voltage is less than the first pass voltage, the fifth pass voltage is less than the second pass voltage and the fourth pass voltage, the sixth pass voltage is less than the third pass voltage and the fifth pass voltage.

16. An apparatus, comprising:

a non-volatile memory array including a first set of non-volatile storage elements coupled to a first word line and a second set of non-volatile storage elements coupled to the second word line, the second word line is adjacent to the first word line;

one or more control circuits configured to read data from the first set of non-volatile storage elements by applying a set of read voltages to the first word line including a first read voltage, a second read voltage, and a third read voltage, the one or more control circuits configured to determine whether data of the second word line is invalid prior to reading the data from the first word line by determining whether data stored by the second set of non-volatile storage elements has been rewritten to another location in the non-volatile memory array, the first read voltage is less than the second read voltage and the second read voltage is less than the third read voltage;

the one or more control circuits configured to respond to determining that the data of the second word line is valid by applying to the second word line a first pass voltage while applying the first read voltage to the first word line, a second pass voltage while applying the second read voltage to the first word line, and a third pass voltage while applying the third read voltage to the first word line, the first pass voltage is greater than the second pass voltage and the second pass voltage is greater than the third pass voltage;

the one or more control circuits configured to respond to determining that the data of the second word line is invalid by applying the first pass voltage while applying the first read voltage, the second read voltage, and the third read voltage to the first word line.

17. The apparatus of claim 16, wherein:

the one or more control circuits are configured to apply to a third word line that is adjacent to the second word line a fourth pass voltage while applying the first pass voltage, the second pass voltage, and the third pass voltage to the first unselected word line; and the fourth pass voltage is less than the third pass voltage.

18. The apparatus of claim 16, wherein:

the one or more control circuits are configured to apply to a third word line that is adjacent to the second word line a fourth pass voltage while applying the first pass voltage to the second word line, the fourth pass voltage is less than the first pass voltage;

the one or more control circuits are configured to apply to the third word line a fifth pass voltage while applying the second pass voltage to the second word line, the fifth pass voltage is less than the second pass voltage and the fourth pass voltage; and the one or more control circuits are configured to apply to the third word line a sixth pass voltage while applying the third pass voltage to the second word line, the sixth pass voltage is less than the third pass voltage and the fifth pass voltage.

19. The apparatus of claim 16, wherein:

the first word line is further from a source line than a third word line of the non-volatile memory array;

the one or more control circuits are configured to apply the set of read voltages to the third word line as part of reading data from a third set of non-volatile storage elements coupled to the third word line;

the one or more control circuits are configured to apply to a fourth word line that is adjacent to the third word line a fourth pass voltage while applying the first read voltage, a fifth pass voltage while applying the second read voltage, and a sixth pass voltage while applying the third read voltage; and the fourth pass voltage is greater than the fifth pass voltage and the first pass voltage, the fifth pass voltage is greater than the sixth pass voltage and the second pass voltage, and the sixth pass voltage is greater than the third pass voltage;

first pass voltage is less than the fifth pass voltage, the second pass voltage is less than the sixth pass voltage, and the third pass voltage is less than the seventh pass voltage.

* * * * *